United States Patent [19]

Yoshizawa et al.

[11] Patent Number: 4,851,768
[45] Date of Patent: Jul. 25, 1989

[54] CHARACTERISTIC TEST APPARATUS FOR ELECTRONIC DEVICE AND METHOD FOR USING THE SAME

[75] Inventors: Masahiro Yoshizawa; Akira Kikuchi, both of Kanagawa; Kou Wada, Tokyo; Minpei Fujinami, Tokyo; Nobuo Shimazu, Tokyo, all of Japan

[73] Assignee: Nippon Telegraph and Telephone Corporation, Tokyo, Japan

[21] Appl. No.: 212,047

[22] Filed: Jun. 24, 1988

Related U.S. Application Data

[63] Continuation of Ser. No. 895,445, Aug. 11, 1986, abandoned.

[30] Foreign Application Priority Data

Aug. 12, 1985 [JP] Japan .............................. 60-177449

[51] Int. Cl.[4] .......................................... G01R 31/26
[52] U.S. Cl. .............................. 324/158 R; 250/310; 250/492.2; 324/158 T
[58] Field of Search .......... 324/158 R, 158 D, 158 T; 250/310, 311, 492.2

[56] References Cited

U.S. PATENT DOCUMENTS 3,531,716 9/1970 Tarui et al. ................. 324/158 R X
3,678,384 7/1972 Oatley ............................. 324/158 R
4,417,203 11/1983 Pfeiffer et al. ............. 324/158 R X
4,420,686 12/1983 Onoguchi et al. ................... 250/310
4,460,866 7/1984 Feuerbaum et al. .......... 324/71.3 X
4,573,008 2/1986 Lischke ........................... 324/158 R

OTHER PUBLICATIONS

Scanning Electron Microscopy/1981/I(pp. 305–322). SEM Inc., AMF O'Hare (Chicago), Ill. 60666, U.S.A., "Electron Beam Test Techniques for Integrated Circuits".
Scanning Electron Microscopy/1983/(pp. 65–75) SEM Inc., AMF O'Hare (Chicago), Ill. 60666 U.S.A., "Secondary Electron Analyzers for Voltage Measurements".
J. Vac. Sci. Technol., vol. 19, No. 4, "Contactless Electrical Testing ..." Pfeiffer et al., Nov./Dec. 1981, pp. 1014–1019.
IBM Technical Disclosure Bulletin, vol. 17, No. 10, "Voltage Comparator System for Contactless Microcircuit Testing", DeStafeno et al., Mar. 1975, pp. 2871–2873.

Primary Examiner—Jerry Smith
Assistant Examiner—Stephen M. Baker
Attorney, Agent, or Firm—Blakely, Sokoloff, Taylor & Zafman

[57] ABSTRACT

In a characteristic test apparatus for an electronic device, a number of voltage supply beams are radiated onto predetermined irradiation positions of the electronic device placed on a sample table. In addition, a potential measuring beam is radiated onto a number of irradiation positions including the predetermined irradiation positions of the voltage supply beams. A secondary electron signal based on the potential measuring beam is detected to measure a potential. When the irradiation position of the potential measuring beam coincides with that of the voltage supply beam, the voltage supply beam is controlled to adjust a potential at the irradiation position to a set value by controlling, e.g., an acceleration power source for the voltage supply beam. When the irradiation position of the potential measuring beam is different from that of the voltage supply beam, a potential at this position is measured. Then, characteristics of the electronic device are calculated based on the obtained potentials at the respective irradiation positions.

25 Claims, 18 Drawing Sheets

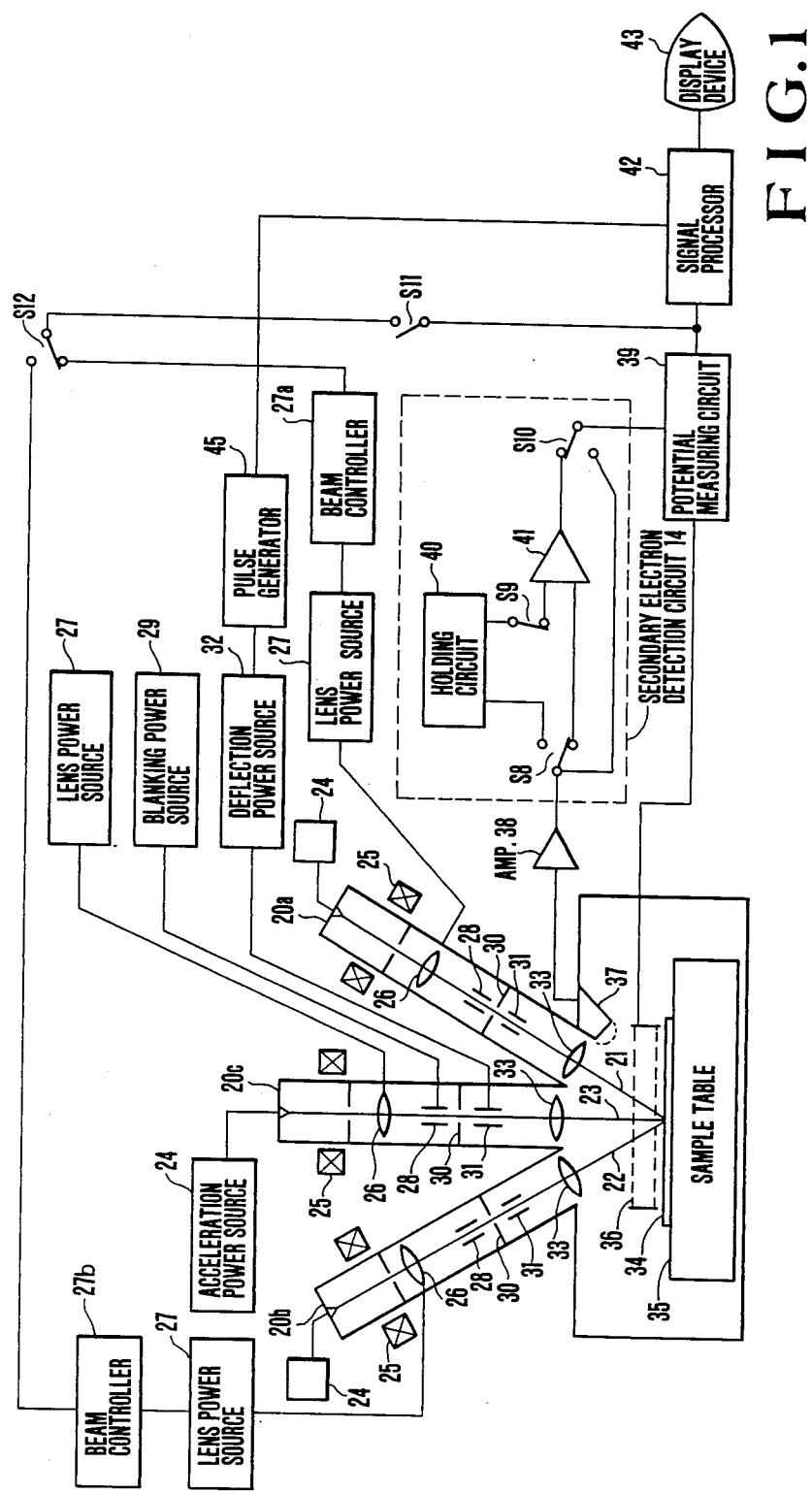

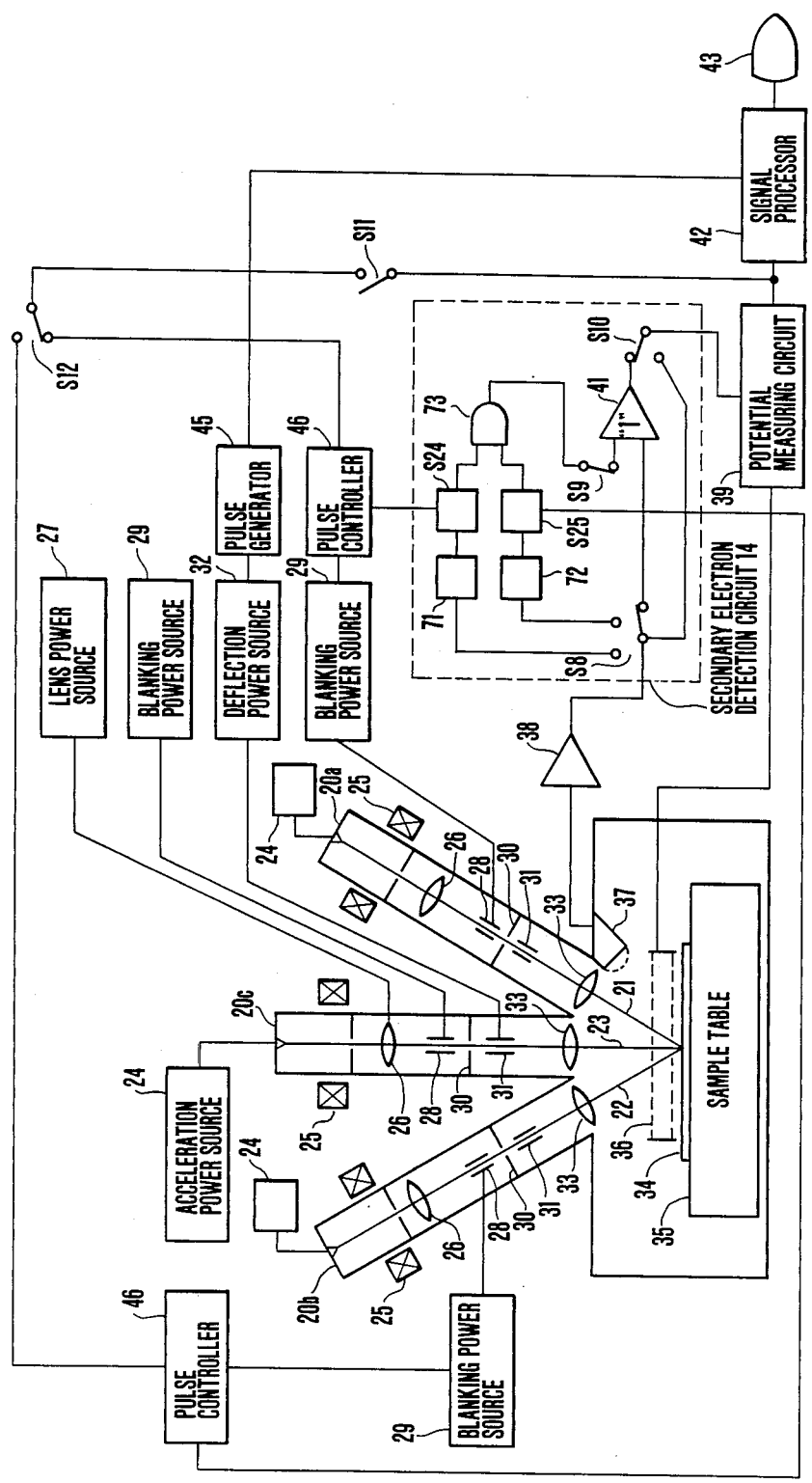

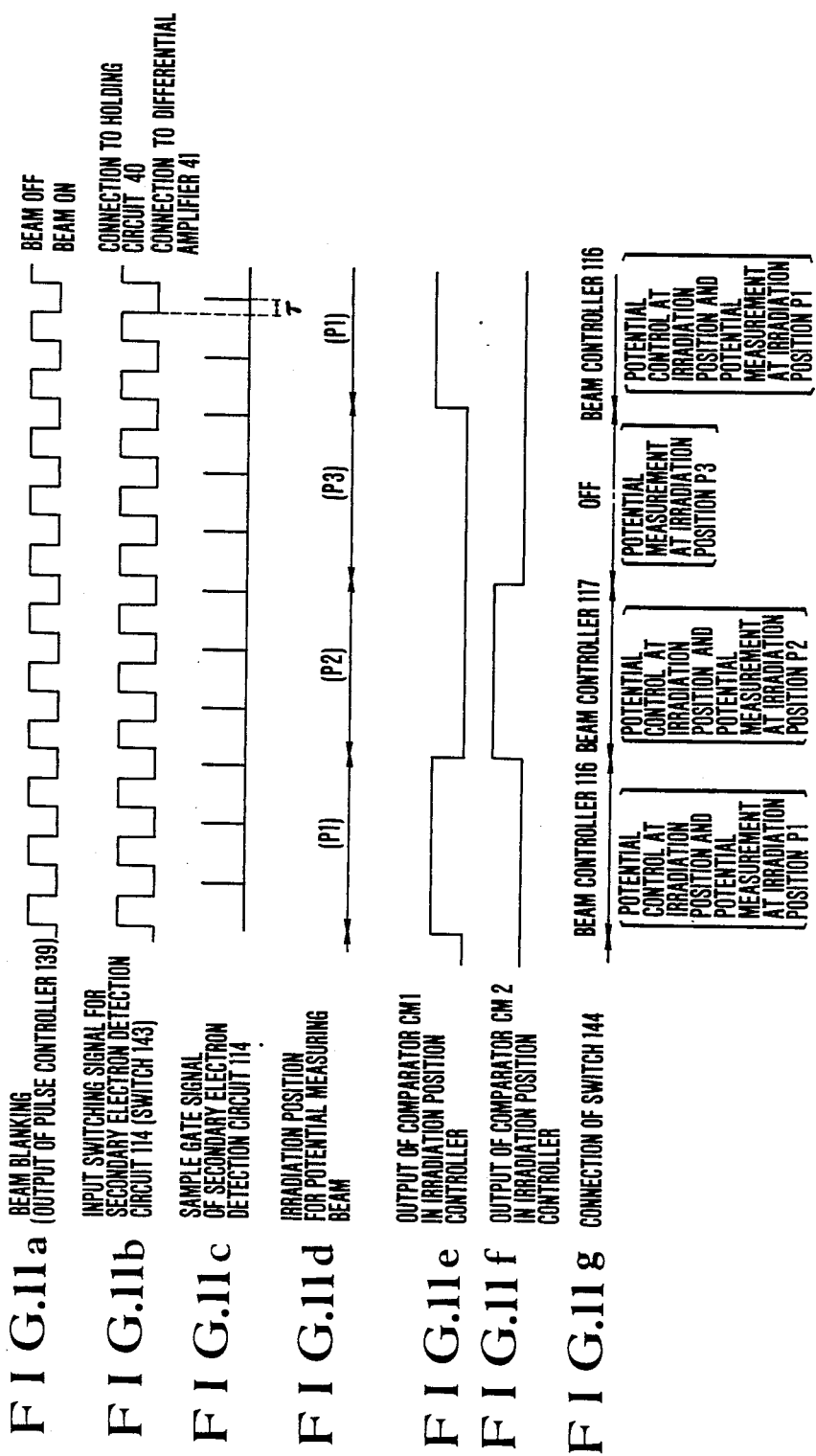

CHARACTERISTIC TEST APPARATUS FOR ELECTRONIC DEVICE AND METHOD FOR USING THE SAME

This is a continuation of application Ser. No. 895,445 filed 8/11/86, now abandoned.

BACKGROUND OF THE INVENTION

The present invention relates to a characteristic test apparatus for an electronic device, which can evaluate the characteristics of an electronic device, e.g., an LSI, a VLSI, a discrete 3-input active element, or the like, or can detect failure during the step of manufacture (i.e., in an in-process state) of such an electronic device.

For an electronic device of this type, a finished electronic device is examined to evaluate its characteristics. However, as the manufacturing process of the device becomes complicated, the characteristics of the device during the manufacturing process often considerably influence those of a finished product. In particular, in a micropatterned, complicated electronic device such as an LSI or a VLSI, testing of the device during the manufacturing process is mandatory, and a need has arisen for development of such a test apparatus.

Conventionally, an electron beam tester using an electron beam having a high spatial resolution has been developed for a test apparatus for a micropatterned, complicated electronic device. In this test apparatus, an IC chip of the electronic device is placed on a test table, and a test bias signal is applied from an IC drive unit through the external terminal of the electronic device. Upon application of the test bias signal, the pattern of the electronic device on the IC chip is scanned, and a voltage at a predetermined position of the electronic device is then measured, thus obtaining data necessary for characteristic evaluation of the electronic device. Such a test apparatus is explained in detail in, e.g., "ELECTRON BEAM TEST TECHNIQUES FOR INTEGRATED CIRCUITS", Scanning Electron Microscopy, 1981, Vol. 1, p. 305.

In such a test apparatus, however, in order to supply the test bias signal, an external terminal pad electrode for supplying the test bias signal to the electronic device must be arranged at an appropriate position of the IC chip, and this electrode occupies a large area of the IC chip relative to the circuit pattern of the electronic device. Therefore, this interferes with decreasing of a space factor of an IC element aiming at a high integration density. Still more, the electronic device must be functionally finished to a state immediately before packaging. Therefore, it is impossible to evaluate the characteristics of the electronic device during its manufacturing period using this test apparatus.

In order to solve the above problems, another test apparatus has been developed. This test apparatus locally radiates a charged beam onto an electronic device, and evaluates the presence/absence of gate leakage or disconnection of metal wirings by detecting secondary electrons from the irradiated position or other position of the device using a secondary electron detector. Such an apparatus is described in, e.g., Japanese Patent Prepublication No. 57-196540 and Japanese Patent Publication No. 45-8820. However, with this apparatus, a secondary electron signal is detected only for evaluation. Thus, a potential of the charged beam at the irradiated point varies over time and cannot be maintained constant, thus preventing a quantitative characteristic test.

SUMMARY OF THE INVENTION

It is therefore an object of the present invention to provide a characteristic test apparatus which can perform a characteristic test of an electronic device even during its manufacturing period.

In order to achieve the above object of the present invention, there is provided a characteristic test apparatus for an electronic device, comprising: a secondary electron detector for detecting secondary electrons generated by a charged beam radiated on the electronic device placed on a sample table; first charged beam radiating means for irradiating a first position of the electronic device with a first charged beam; first adjusting means for adjusting a potential at the first position to a first set value based on secondary electron signal for the first position detected by the secondary electron detector; second charged beam radiating means for irradiating a second position of the electronic device with a second charged beam; second adjusting means for adjusting a potential at the second position to a second set value based on secondary electron signal for the second position detected by the secondary electron detector; third charged beam radiating means for irradiating a third position of the electronic device with a third charged beam; and means for calculating characteristics of the electronic device by obtaining potentials at the respective positions of the electronic device based on the secondary electron signal detected by the secondary electron detector upon radiation of the charged beams onto the first, second, and third positions of the electronic device.

BRIEF DESCRIPTION OF THE DRAWINGS

FIG. 1 is a diagram of one embodiment of a characteristic test apparatus for an electronic device according to the present invention;

FIG. 4 is a diagram of another embodiment of a characteristic test apparatus according to the present invention;

FIGS. 11a to 11g are timing charts for explaining the operation of the apparatus, shown in FIG. 9;

DETAILED DESCRIPTION OF THE PREFERRED EMBODIMENTS

Figure 2A:
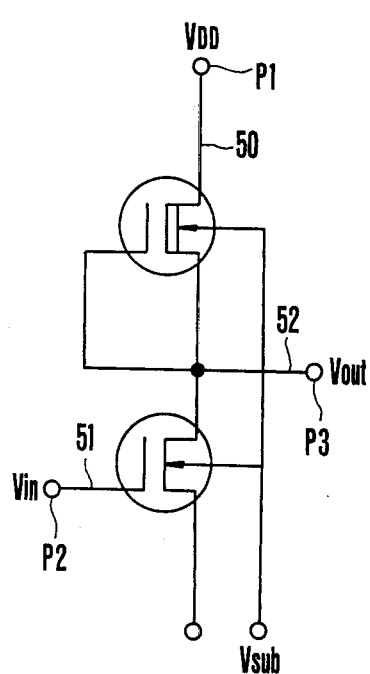
FIGS. 2A and 2B are a circuit diagram of the electronic device to be measured by the apparatus shown in FIG. 1, and a representation showing a detailed pattern thereof.

FIG. 1 shows one embodiment of a characteristic test apparatus for an electronic device of the present invention. A characteristic test apparatus shown in FIG. 1 has three columns 20a, 20b, and 20c. Of these columns, the columns 20a and 20b emit charged beams to predetermined positions of an electronic device 34 to supply a voltage to the irradiation position, and the column 20c emits a charged beam to measure a potential at the corresponding irradiated position of the electronic device 34.

These columns 20a to 20c are integrally arranged in a casing incorporating a sample table 35 for placing the electronic device 34 thereon. However, since these columns have the same structure, the structure of the column 20c will be mainly described below.

Referring to FIG. 1, the column 20c includes an alignment deflector 25, a lens 26, a blanker 28, a blanking aperture 30, a deflector 31 for radiating the charged beam on the predetermined position of the electronic device 34, and an objective lens 33 for focusing, as those of a known SCANNING ELECTRON MICROSCOPE (SEM). The column 20c guides the charged beam onto the predetermined irradiation position of the electronic device 34 placed on the sample table 35 while controlling it by the above-mentioned components. The respective components constituting the respective columns are respectively connected to predetermined drive sources. More specifically, the lens 26 is connected to a lens power source 27, the blanker 28 is connected to a blanking power source 29, and the deflector 31 is connected to a deflection power source 32. In this embodiment, only a pair of the deflector 31 and the deflector power source 32 are illustrated. However, in practice, it should be noted that two pairs of deflectors and deflection power sources are used in order to deflect a charged beam in X and Y directions.

Therefore, voltage supply beams 21 and 22 respectively emitted by the voltage supply beam columns 20a and 20b are accelerated by the acceleration power source 24, and are radiated onto first and second irradiation positions on the electronic device 34 placed on the sample table 35. A potential measuring beam 23 emitted by the potential measuring beam column 20c is also accelerated by the acceleration power source 24, and is radiated on a third irradiation position on the electronic device 34 placed on the sample table 35. The electronic device 34 used herein need not be a finished device, but includes a wafer during the manufacturing process (an in-process wafer). A beam current is adjusted by changing the voltage of the lens power source 27. The ON and OFF states of the charged beams are controlled by a voltage applied to the blanker 28 from the blanking power source 29.

An energy analyzer 36 is arranged on the sample table 35 to be separated from the electronic device 34 placed thereon. The energy analyzer 36 analyzes energy of secondary electrons generated from the electronic device 34 so as to obtain its potential by a potential measuring circuit 39. The energy analyzer and the potential measuring circuit are described in detail in "SECONDARY ELECTRON ANALYZERS for VOLTAGE MEASUREMENTS", SCANNING ELECTRON MICROSCOPY, 1983, VOL. 1, p. 65.

A secondary electron detector 37 is arranged above the energy analyzer 36, and detects secondary electrons generated by irradiating the electronic device 34 with the charged beam. The detector 37 supplies its output to an amplifier 38. An output from the amplifier 38 is connected to the potential measuring circuit 39 through the stationary and movable contacts of a switch S10. The output from the amplifier 38 is also connected to one input terminal of a differential amplifier 41 with a unity gain through the movable and stationary contacts of a switch S8 as a component of a secondary electron detection circuit 14, and is further connected to the input terminal of a holding circuit 40 through the other stationary and movable contacts of the switch S8. The output terminal of the holding circuit 40 is connected to the other input terminal of the differential amplifier 41 through a switch S9. The holding circuit 40 holds a secondary electron signal level when a device potential is set. An output from the differential amplifier 41 constituting the secondary electron detection circuit 14 is connected to the potential measuring circuit 39 through the other stationary and movable contacts of the switch S10. An output from the potential measuring circuit 39 corresponds to the potential, and is supplied to a display device 43 through a signal processor 42 for processing the potential measurement result to be displayed thereon.

An output from the potential measuring circuit 39 is also supplied, through switches S11 and S12, to a beam controller 27a, so that the potentials at the irradiated positions have predetermined values. The beam controller 27a is connected to the lens power sources 27 for controlling the beam currents of the voltage supply beams from the voltage supply beam columns 20a and 20b. The switch S12 selects the voltage supply beam to be controlled, and the switch S11 connects or disconnects the beam controller 27a and the potential measuring circuit 29. The deflection power source 32 is connected to the deflector 31 for controlling the potential measuring beam 23 radiated on the predetermined irradiation position on the electronic device 34, and is connected to a pulse generator 45 to receive a relatively high repetitive frequency signal therefrom. Thus, the application interval of the potential measuring beam to the irradiation position is controlled, and the output from the pulse generator 45 is also supplied to the signal processor 42, thereby controlling a processing or operating time period thereof.

The operation of the characteristic test apparatus 10 with the above arrangement will now be described with reference to FIGS. 2A and 2B.

Figure 2B:
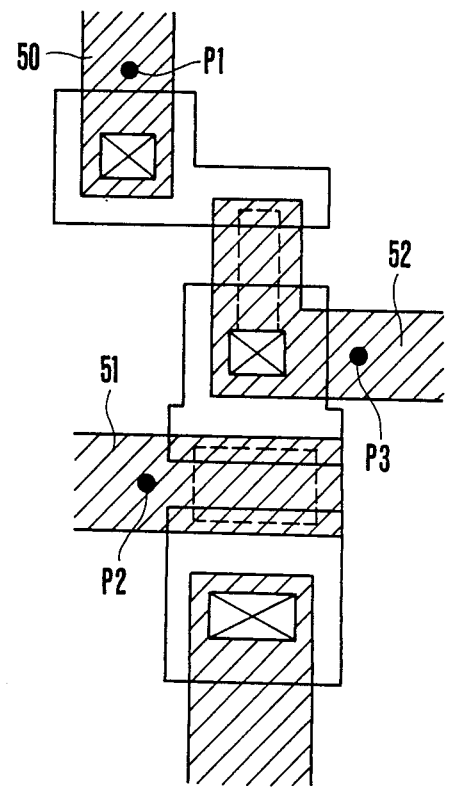

FIGS. 2A and 2B exemplify an E/D inverter, which is an example to be measured by the apparatus shown in FIG. 1. Referring to FIGS. 2A and 2B, a constant drive volta $V_{DD}$ is continuously applied to a wiring 50. An input voltage Vin applied to a wiring 51 is changed and a change in output voltage Vout upon a change in voltage Vin is measured to obtain a threshold voltage. In conventional measurement, a power source and a measurement device are connected to an external terminal, so that application of the drive voltage $V_{DD}$ and the input voltage Vin and measurement of the output voltage Vout are allowed. In this invention, the above-mentioned processing is performed in a non-contact manner.

Referring to FIG. 2B, reference symbols P1 to P3 denote irradiation positions.

In the apparatus of this embodiment, the irradiation position P1 of the wiring 50 is irradiated with the voltage supply beam 21 and is set at a potential of the power source voltage $V_{DD}$. More specifically, when the first irradiation position (drain) P1 is set at $V_{DD}$ by means of the volaage supply beam 21, the switch S10 is connected directly to the output side of the amplifier 38, and the switches S11 and S12 are connected, so that the output from the amplifier 38 is input to the potential measuring circuit 39, and the output from the circuit 39 is also connected to the beam controller 27a for controlling the beam current of the voltage supply beam 21. Then, the beam controller 27a is controlled to set the potential of the first irradiation position P1 at $V_{DD}$.

A method for setting a potential will now be described. When a negative potential is set, a negatively charged beam (electron beam) is used and is accelerated to obtain a secondary emission ratio $\delta$ smaller than 1. When a positive potential is set, an electron beam of an acceleration voltage corresponding to a secondary emission ratio $\delta$ larger than 1 or a positively charged beam can be used. In this apparatus, the output from the potential measuring circuit 39 is fed back to the beam controller 27a for controlling the beam current of the column 20a, and the lens power source 27 is thereby adjusted to increase or decrease the beam current, so that the potential is made constant. Then, the switches S8 and S10 are switched to provide the beam current to the beam controller 27a and to store the secondary electron signal in a holding circuit 40 when the potential of the first irradiation position is constant by irradiation of the voltage supply beam 21.

After the setting operation, the switch S12 is switched to the column 20b side, so that the irradiation position (gate) P2 of the wiring 51 is irradiated with the voltage supply beam 22. Thus, the beam controller 27b s controlled to set the wiring 51 at a potential of a gate voltage, i.e., the input voltage Vin, in the same manner as in the voltage supply beam 21.

Following this, switch S11 is opened, and the movable contact of the switch S10 is connected to its stationary contact at the output side of the differential amplifier 41. The movable contact of the switch S8 is connected to its stationary contact at the holding circuit 40 side, and the switch S9 is then closed. The first and second voltage supply beams 21 and 22 are radiated on the predetermined positions P1 and P2 of the electronic device 34 placed on the sample table 35. As a result, a secondary electron signal obtained by the secondary electron detector 37 is amplified by the amplifier 38, and is then stored in the holding circuit 40 of the secondary electron detection circuit 14.

In this state, the potential measuring beam 23 is radiated on the third irradiation position (output wiring portion) P3 of the electronic device 34. A secondary electron signal $S_t$ detected by the secondary electron detector 37 is generated by radiating all the charged beams to the electronic device 34. Therefore, when the movable contact of the switch S8 is switched to the input side of the differential amplifier 41, the output from the differential amplifier 41 corresponds to a value obtained by subtracting a secondary electron signal Sab with only the charged beams 21 and 22 from the total secondary electron signal $S_T$. In this way, the output voltage Vout corresponding to the application gate voltage Vin of this inverter can be obtained.

After the drive voltage $V_{DD}$ is set by the charged beam 21, the charged beam 22 is radiated to the wiring 51 to change the potential at the irradiation position P2. After setting the potential of P2, the charged beam 23 is radiated to measure the potential at the irradiation position P3 on the wiring 52. When the input voltage Vin exceeds the threshold voltage $V_{TH}$, the output voltage Vout is inverted and its potential changes. Therefore, the threshold voltage can be determined by measuring the input voltage Vin when the output voltage Vout is inverted. If the potential at the irradiation position P2 is measured as well as that of the irradiation position P3, a change in output voltage Vout for the input voltage Vin can be obtained as one of transistor characteristics. In addition, the input voltage Vin is initially set, and a change in output voltage Vout for the drive voltage $V_{DD}$ can then be measured. For example, when an electrode having a relatively large capacitance is connected to a wiring 50 as in a MOSFET memory, if radiation of the changed beam is stopped after the drive voltage $V_{DD}$ is set, charges can be held. In this case, the output voltage Vout is monitored by means of the charged beam 22 while irradiating a gate electrode, i.e., the irradiation position P2 with the charged beam 21, and a gate voltage when the charges are abruptly removed can be measured to obtain the threshold value of a transistor. This method is also applied when there is no high load resistor.

In this above description, the irradiation positions P1, P2, and P3 are exemplified, but need not be points. Voltage supply and potential measurement can be performed by planar scanning around the points so as not to fall outside the wiring. This can advantageously average a voltage in the irradiated wiring. Any of the columns can be used for supplying the drive voltage $V_{DD}$ However, the irradiation positions can be easily controlled, if the potential measuring beam 23, which is obtained by deflecting a charged beam and is radiated on the irradiation position for measuring the potential, is generated from the vertically arranged column 20a, and supply of the drive voltage $V_{DD}$, and the like is performed by the obliquely radiated voltage supply beams 21 and 22, as shown in FIG. 1. Note that the three columns need not be the same. Since the obliquely arranged, first and second columns are used for voltage supply, they need not have high performance as long as a constant beam current for a charged beam can be obtained.

Figure 3:
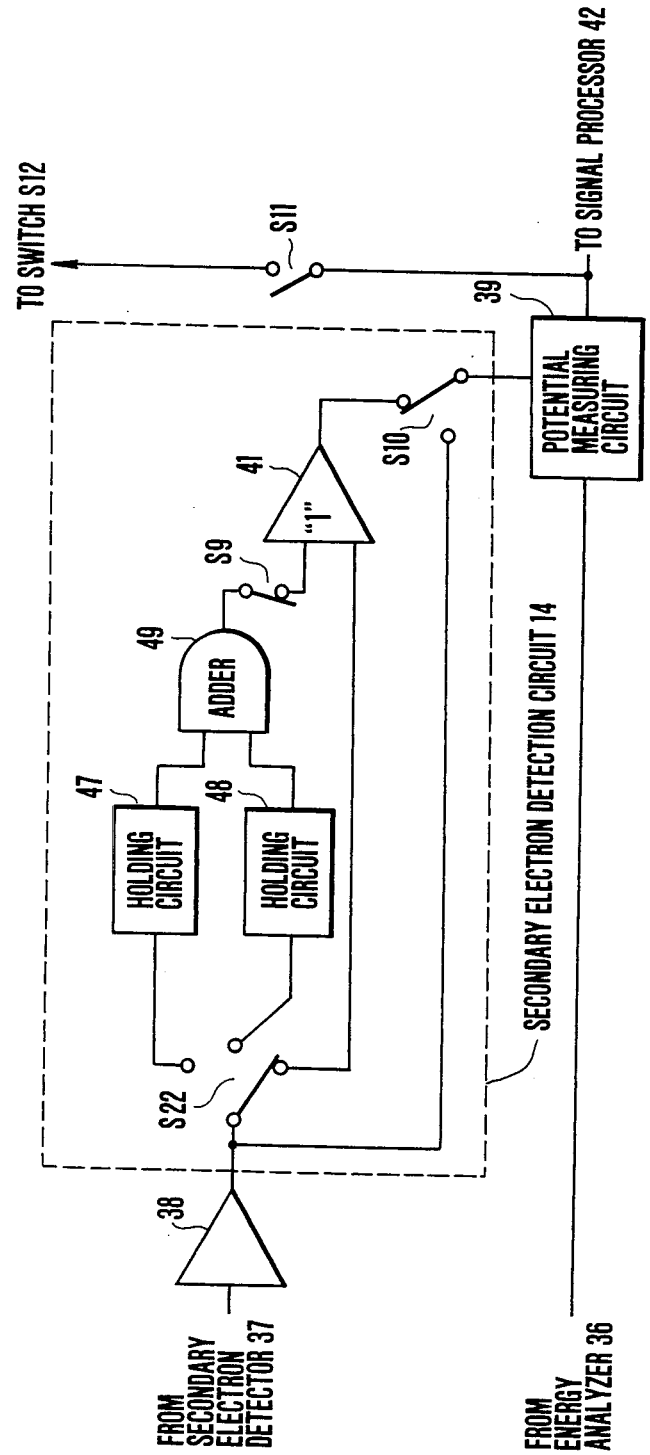
FIG. 3 is a block diagram of the modification of a secondary electron detection circuit.

In another method for obtaining the output voltage Vout of FIG. 2A, secondary electron signals Sa and Sb are respectively obtained when the voltage supply beams 21 and 22 are radiated on the electronic device 34, and the signal Sab (=Sa+Sb) can be subtracted from the total secondary signal $S_T$ obtained by radiating all the charged beams to obtain the output voltage Vout. FIG. 3 shows a detailed arrangement therefor. FIG. 3 illustrates the modification of the secondary electron detection circuit 14. Referring to FIG. 3, reference numerals 47 and 48 denote holding circuits; 49, an adder; and S23, a switch. The holding circuits 47 and 48 store the secondary electron signals when the voltage supply beams 21 and 22 are separately radiated to the first and second irradiation positions to measure the potential. The switch S23 connects the amplifier 38 and the holding circuit 47 when the voltage supply beam 21 is radiated on the first irradiation position and the potential thereat reaches a predetermined value and connects the amplifier 38 and the holding circuit 48 when the voltage supply beam 22 is radiated on the second irradiation position and the potential thereat reaches a predetermined value. In this manner, the holding circuits 47 and 48 hold the secondary electron signals at the predetermined voltage. This switching operation is interlocked with the switch S11, which allows feedback of the potential to the beam controller 27a when the potential is set. When the potential at the third irradiation position is measured, the amplifier 38 is connected to the differential amplifier 41, and the sum of the outputs of the holding circuits 47 and 48 is generated from the adder 49 and is input to the differential amplifier 41 with a unity gain through the switch S9. A difference between the outputs from the amplifier 38 and the adder 49 is obtained by the differential amplifier 41 and is supplied to the potential measuring circuit 39. In this embodiment, measurement is allowed even if one of the voltage supply beams 21 and 22 is turned off.

FIG. 4 shows another embodiment of the present invention, and exemplifies a case wherein voltage supply beams 21 and 22 are pulse beams. Referring to FIG. 4, reference numerals 71 and 72 denote holding circuits; 73, an adder; and S24 and S25, switches. These components constitute a secondary electron detection circuit 14 together with switches S8 and S9 and a differential amplifier 41. Note that the same reference numerals in FIG. 4 denote the same parts as in FIG. 1. In the apparatus of this embodiment, voltage supply beams 21 and 22 are pulse beams, and an output from a potential measuring circuit 39 is fed back to a pulse controller 46 which controls a blanking period for setting a potential, so as to change an ON/OFF time, thus making the potential constant. The switches S24 and S25 select whether or not a feedback output is to be supplied to columns 20a and 20b or which one of the columns 20a and 20b receives the feedback output. Secondary electron signals are separately obtained upon radiation of first, second, and third charged beams, in the same manner as in FIG. 3. More specifically, a secondary electron signal Sa when only the voltage supply beam 21 is turned on is stored in the holding circuit 71, a secondary electron signal Sb when only the voltage supply beam 22 is turned on is stored in the holding circuit 72. Then, the sum Sa+Sa (=Sab) (the output from the adder 73) can be subtracted from a total secondary electron signal $S_T$ when all the beams 21, 22, and 23 are turned on. In this case, since the voltage supply beams 21 and 22 are pulse beams and are turned on and off, the ON/OFF operation of the switch S24 is performed in synchronism with radiation of the voltage supply beam 21 by the pulse controller 46 for controlling the ON/OFF state of the beam 21, and the ON/OFF operation of the switch S25 is performed in synchronism with radiation of the voltage supply beam 22 by another pulse controller 46 for controlling the ON/OFF state of the beam 22. For example, if the voltage supply beam 21 is turned on and the voltage supply beam 22 is turned off, the switch S24 is turned on, the switch S25 is turned off, and the switch S9 is turned on. Therefore, the secondary electron signal Sa based on the voltage supply beam 21 can be subtracted from the total secondary electron signal $S_T$ by the differential amplifier 41.

Figure 5A:
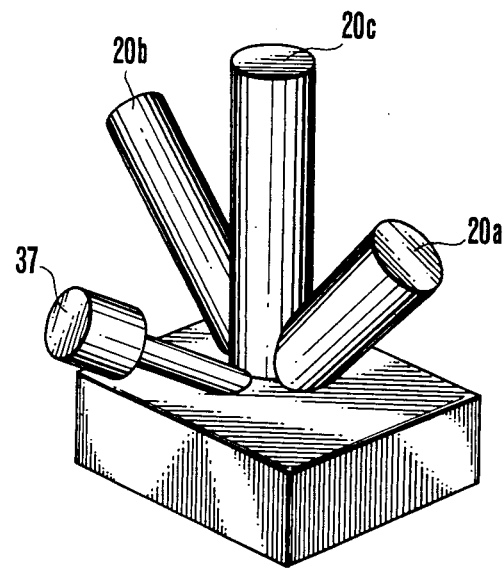
FIGS. 5A and 5B are illustrations showing detailed positional relationships between three columns and a secondary electron detector used in the test apparatus.
Figure 5B:
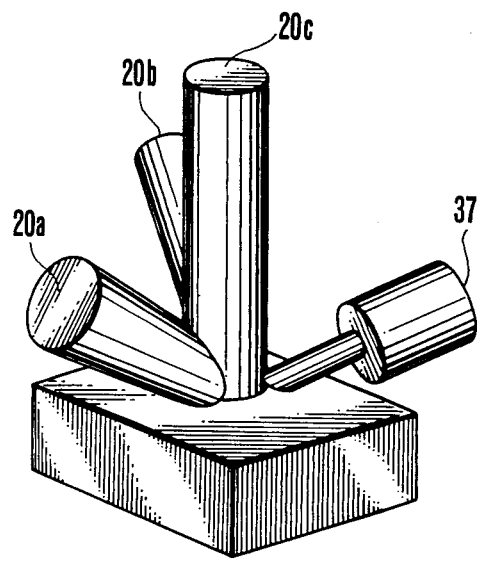

In FIGS. 1 and 4, the first, second, and third columns and the secondary electron detector 37 are arranged in an identical plane for the sake of simplicity, but need not be in the identical plane. FIGS. 5A and 5B show the arrangement of the three columns and the secondary electron detector 37 when viewed from a position obliquely above the arrangement. In FIGS. 5A and 5B, the third column 20c is arranged perpendicular to a wafer placed on a horizontal sample table. In contrast to this, two different arrangements of the first and second columns 20a and 20b are respectively shown in FIGS. 5A and 5B. Referring to FIG. 5A, the first and second columns 20a and 20b are arranged in the identical plane, and the secondary electron detector 37 is arranged perpendicular to this plane. Referring to FIG. 5B, the first and second columns 20a and 20b and the secondary electron detector 37 are arranged in three different directions. When all the three columns and the secondary electron detector 37 are arranged in the identical plane, angles defined by the respective columns and the secondary electron detector 37 are different from each other, resulting in different detection amounts of secondary electrons and reflected electrons in the respective columns. The arrangements shown in FIGS. 5A and 5B can prevent this. In addition to this, in the arrangement shown in FIG. 5A, when a plurality of secondary electron detectors are arranged in different planes perpendicular to the plane in which the columns are arranged, variations in secondary electron signal caused by a roughened surface of the device can be reduced.

Figure 6:
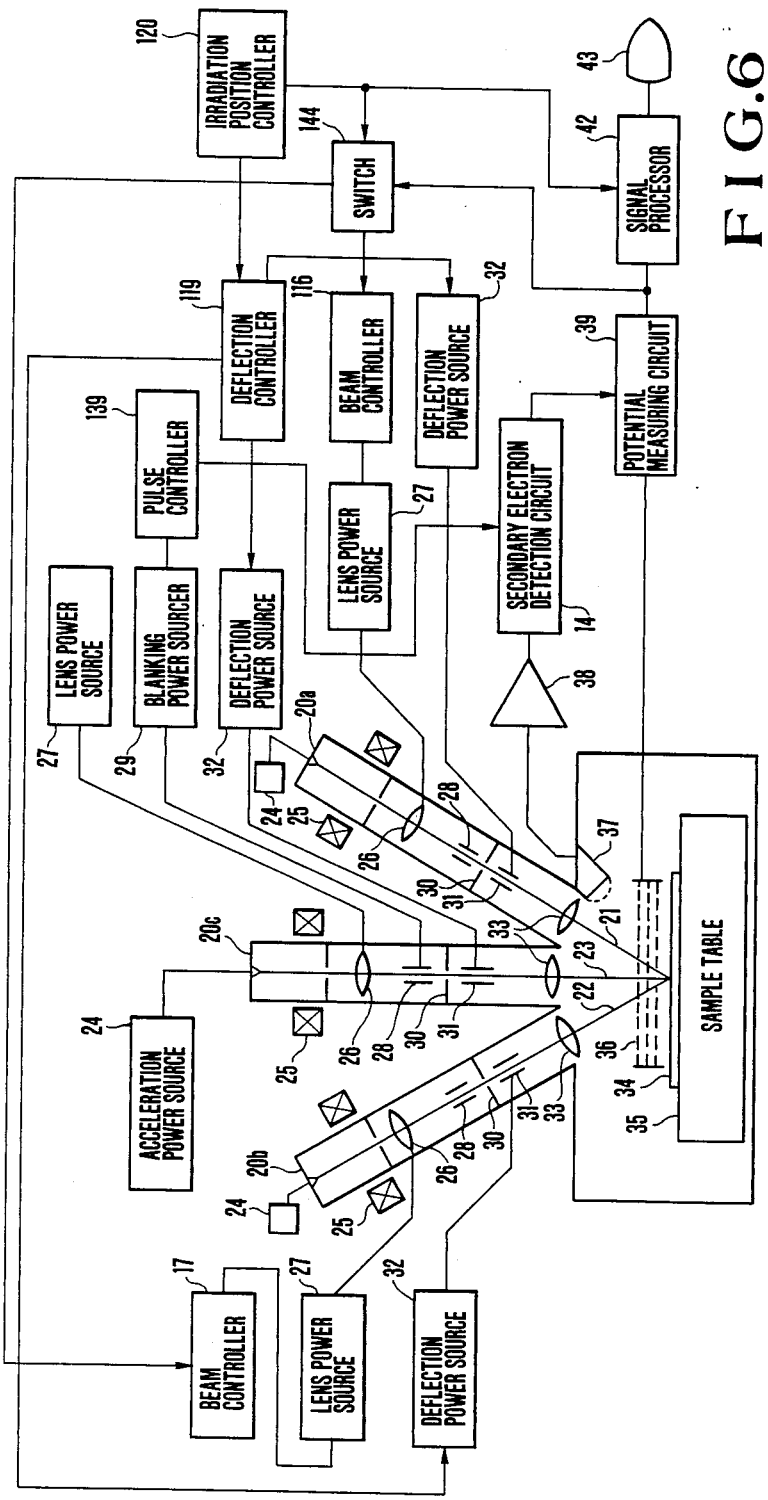
FIG. 6 is a diagram of still another embodiment of a characteristic test apparatus of the present invention.

FIG. 6 shows still another embodiment of a characteristic test apparatus of the present invention. In this embodiment, potentials at charged beam irradiation positions can be controlled to a predetermined set value while radiating a plurality of charged beams onto an electronic device. The same reference numerals in FIG. 6 denote the same parts as in FIG. 1. Referring to FIG. 6, reference numeral 114 denotes a secondary electron signal detection circuit, which has a function for separating and detecting secondary electrons generated by radiation of a specific beam from those generated upon radiation of a plurality of the electron beams onto an electronic device 34. Reference numerals 116 and 117 denote beam controllers for setting potentials at positions irradiated with charged beams 21 and 22 to be a predetermined voltage $V_R$. These controllers 116 and 117 control a beam current so that the potentials at the irradiation positions are equal to the voltage $V_R$. Reference numeral 119 denotes a deflection controller for controlling a beam deflection amount. The controller 119 causes deflection power sources 32 for charges beams 21, 22, and 23 to generate a predetermined voltage in accordance with irradiation positions specified by an irradiation position controller 120.

Figure 7:
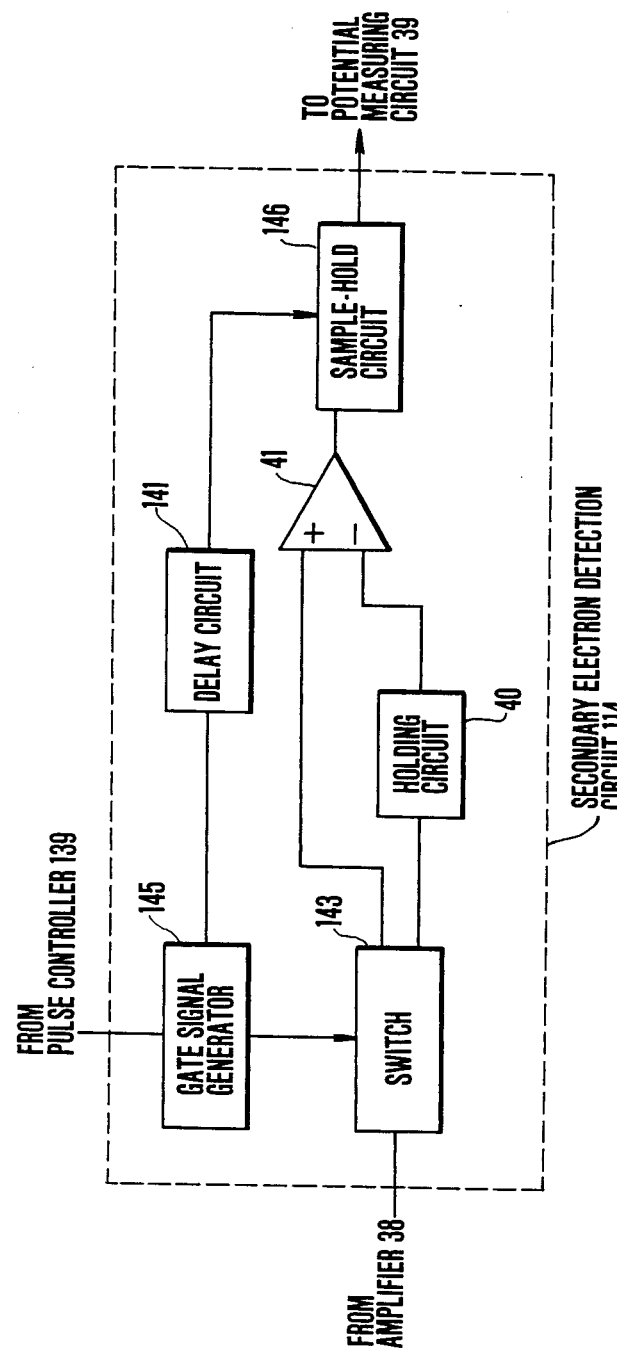
FIGS. 7 and 8 are detailed circuit diagrams of a secondary electron detection circuit used in the apparatus shown in FIG. 6.

The secondary electron signal detection circuit 114 will now be described in detail. When a plurality of beams are radiated, secondary electrons generated irradiation with the respective beams are detected by the identical secondary electron detector 37 at the same time, and a secondary electron signal based on irradiation with a specific beam must be separated and detected from these electrons to measure the potential at the corresponding beam irradiation position. The principle and the arrangement thereof will be described below. A case will be described wherein a secondary electron signal upon radiation of the potential measuring charged beam 23 is separately detected. A secondary electron signal Sab when the beam 23 is turned off corresponds to that generated by the voltage supply beams 21 and 22. When the beam 23 is turned on, a secondary electron signal Sc generated by the beam 23 is added to the signal Sab. Therefore, the secondary electron signal Sc can be detected from a difference between the secondary electron signals when the beam 23 is turned on and off. FIG. 7 illustrates the secondary electron signal detection circuit 114. In this circuit, the secondary electron signal Sab when the beam 23 is turned off is stored, and is subtracted from the total secondary electron signal $S_T$, thereby detecting the secondary electron signal Sc based on the beam 23. More specifically, when the potential measuring beam 23 is turned off, an output from an amplifier 38 is input to a holding circuit 40 through a switch 143, thus holding the signal Sab therein. Next, the potential measuring beam 23 is emitted while leaving the beams 21 and 22 unchanged, and a secondary electron signal obtained by simultaneously detecting the secondary electrons based on the beams 21, 22, and 23 is amplified by the amplifier 38. The secondary electron signal is then supplied to a differential amplifier 41 through the switch 143 so as to obtain a difference between itself and the secondary electron signal Sab held in the holding circuit 40. In this manner, the secondary electron signal Sc based on the beam 23 can be detected by eliminating the influence of a plurality of beam radiations. The thus detected secondary electron signal based on the beam 23 is input to a potential measuring circuit 39 to measure the potential. This principle is basically the same as that explained with reference to FIG. 1. However, this embodiment utilizes a pulse beam as the potential measuring beam. More specifically, a pulse beam is used as the potential measuring beam 23, and inputs to the holding circuit 40 and the differential amplifier 40 are switched in synchronism with the ON/OFF state of the beam 23, so that the secondary electron signal Sab based on the voltage supply beams 21 and 22 is subtracted from the total secondary electron signal $S_T$. In this manner, the secondary electron signal can be continuously detected. For this purpose, a gate signal is generated from a gate signal generator 145 in synchronism with pulses from a pulse generator 139 for driving a blanking power source 29, so that the output of the amplifier 38 is supplied to the holding circuit 40 during the OFF period of the beam 23, and to the differential amplifier 41 during the ON time thereof. The switch 143 is switched in response to the gate signal. The gate signal is also supplied to a sample-holding circuit 146 at the output side of the differential amplifier 41. The secondary electron signal when the switch 143 is connected to the differential amplifier 41 (during the ON time of the beam 23) is then sampled and held by the sample-holding circuit 146. Thereafter, the held value is input to the potential measuring circuit 38, thus measuring the potential (since the circuit 38 detects the secondary electron signal based only on the beam 23 only during the ON time of the beam 23).

Figure 8:
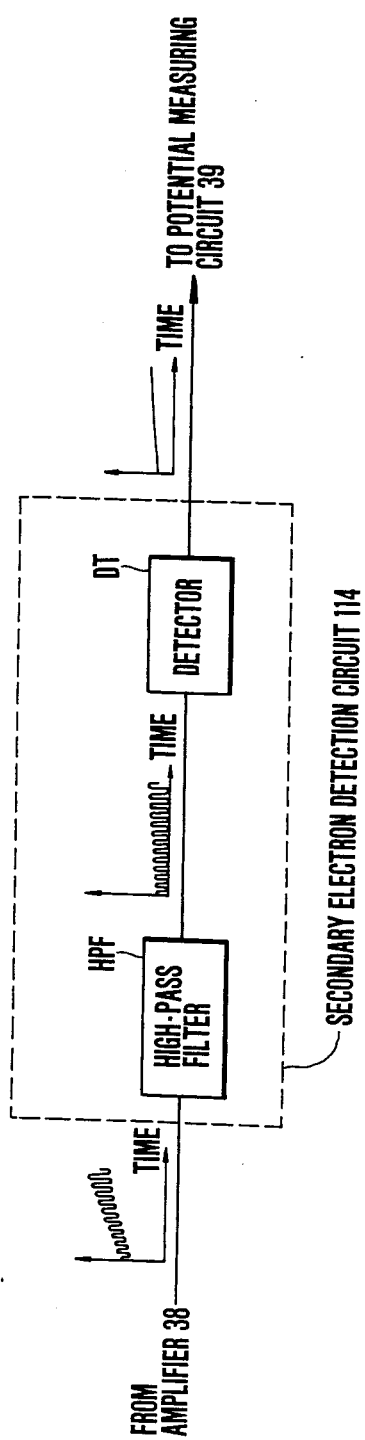

FIG. 8 shows another modification of a secondary electron detection circuit. Referring to FIG. 8, a blanking voltage controlled by a pulse signal at a specific frequency from the pulse controller 139 is applied to the blanking power source 28 for the potential measuring beam 23, thus irradiating the electronic device with the pulse beam. In this case, the beam 23 is also emitted when the voltage supply beams 21 and 22 are emitted. Of the secondary electron signals detected at this time, the secondary electron signal based on the beam 23 is a signal pulsed at the above specific frequency. Therefore, the signals based on the voltage supply beams at a low frequency are removed using a high-pass filter HPF including the frequency of the pulse generator, thereby detecting the secondary electron signal based on the beam 23. This signal is detected by a detector DT and is input to the potential measuring circuit 39.

The beam controllers 116 and 117 for setting the potential at the irradiation positions at the target voltage $V_R$ will be described. Normal potential setting methods include a method for controlling the beam currents of the voltage supply beams 21 and 22, a method for controlling the acceleration power source 24, and a method for controlling the ON/OFF time of the beams 21 and 22 when they are pulse beams. In the apparatus shown in FIG. 6, the beam currents are controlled to set the potentials. However, other control methods can be used. When the target voltage $V_R$ is a negative voltage, a negatively charged beam (electron beam) is used, and is radiated at an acceleration voltage corresponding to a secondary emission ratio δ smaller than 1. When the target voltage $V_R$ is a positive voltage, an electron beam at an acceleration voltage corresponding to a secondary emission ratio δ larger than 1 or a positively charged beam is radiated. The output from the potential measuring circuit 39 is fed back to the beam controllers 116 and 117, and the lens power sources 27 are adjusted so that the potentials are equal to the target voltage $V_R$, thereby increasing or decreasing the beam currents. When the absolute value of the potential is larger than that of the voltage $V_R$, the beam current is decreased; otherwise, it is increased.

Figure 9:
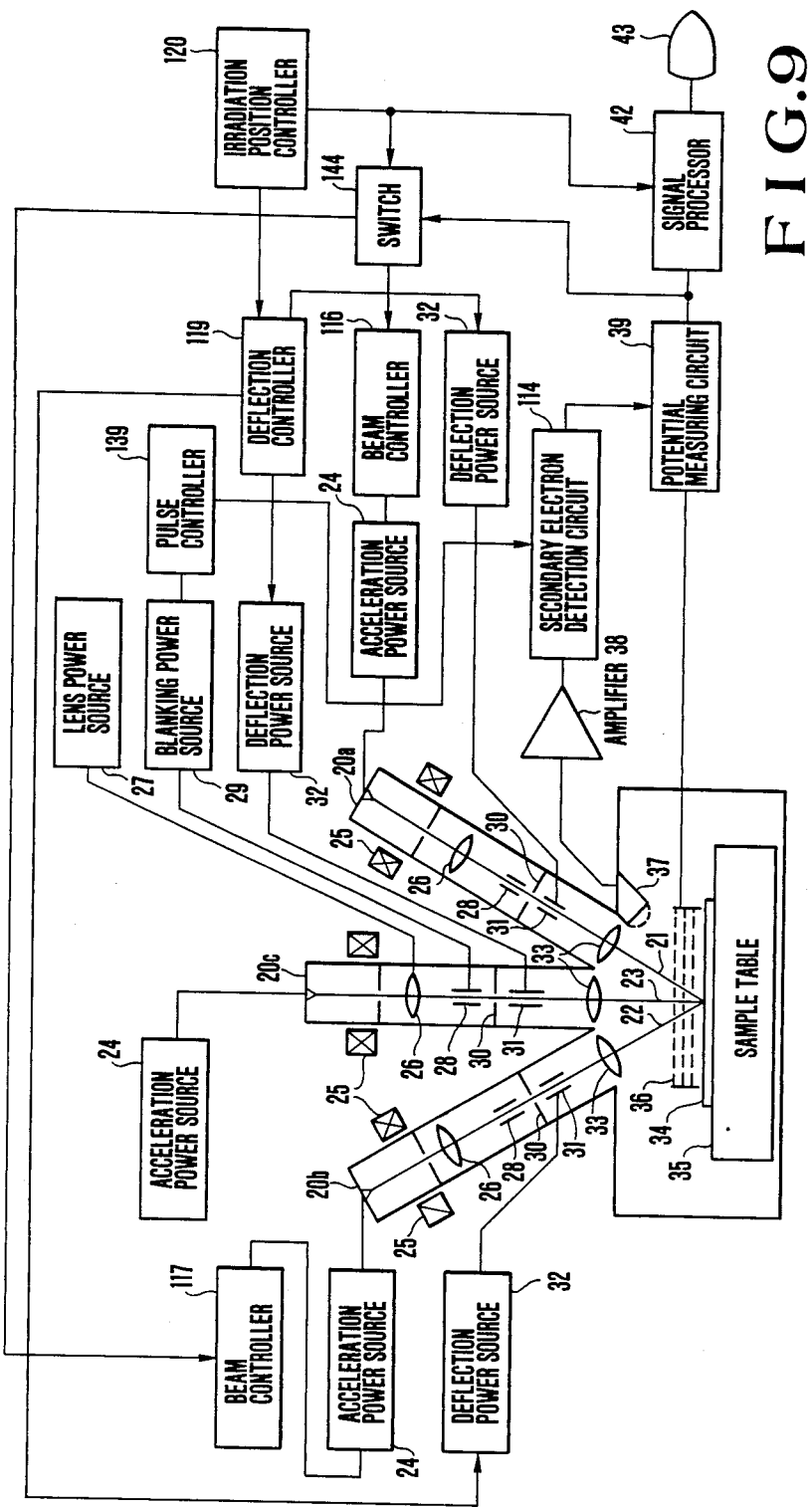
FIG. 9 is a diagram of still another embodiment of a characteristic test apparatus of the present invention.

FIG. 9 shows still another embodiment of a characteristic test apparatus of the present invention, wherein potential setting is performed upon control of an acceleration voltage. The same reference numerals in FIG. 9 denote the same functional blocks as in FIG. 6. Outputs from beam controllers 116 and 117 are connected to acceleration power sources 24 for voltage supply beams 21 and 22. When the potential at an irradiation position is higher than a volta $V_R$, the acceleration voltage is controlled to obtain a secondary emission ratio δ smaller than 1 in order to decrease the potential; otherwise, it is controlled to obtain a ratio δ larger than 1 in order to increase the potential. Other control operations are the same as those in FIG. 1.

When the voltage supply beams 21 and 22 are pulse beams, the potential setting operation can be performed as follows. Signals having the same phase for each pulse of the secondary electron signals are compared, and the output from a potential measuring circuit 39 is fed back to the beam controller 27a or beam controller 27b for voltage supply beams 21 and 22, respectively, to change the ON/OFF time of the pulse beam, so that the comparison value is equal to the voltage $V_R$. For example, when the absolute value of the potential is larger than that of the volaage $V_R$, the ON time of the beam can be shortened (or the OFF time thereof is prolonged); otherwise, the ON time of the beam can be prolonged (or the OFF time thereof is shortened).

The switching operation of the beam controllers 116 and 117 will be described below. The potential measuring beam 23 is radiated onto the irradiation position of the voltage supply beam 21 or 22 to measure the potentials thereat. Based on the measure potentials, the voltage supply beams 21 and 22 are controlled. In this case, the same method and apparatus for separating the secondary electron signal based on the beam 23 and measuring the potential as described previously are used. When the potential measuring beam 23 is radiated onto the irradiation position of the voltage supply beam 21, the output from the potential measuring circuit 39 corresponds to the potential at the irradiation position of the beam 21. Then, the switch 144 is switched to connect the output from the circuit 39 to the beam controller 116. When the beam 23 is radiated onto the irradiation position of the voltage supply beam 22, the switch 144 is switched so that the output from the potential measuring circuit 39 is connected to the beam controller 117. When the beam 23 is radiated onto a position other than the irradiation positions of the beams 21 and 22, the potential thereat is simply measured, and the measured result is not fed back to the beam controllers 116 and 117. In addition, the voltage supply beams 21 and 22 are radiated under the radiation conditions before the feedback operation is interrupted. At this time, the switch 144 is not connected to any component or is connected to the column for the potential measuring beam 23 to feed back the measured result thereto. In this case, the measured result is used to control the acceleration voltage to obtain a secondary emission ratio $\delta$ of 1. The switching operation of the switch 144 is performed in synchronism with deflection of the beam 23. The deflection method will be described hereinafter.

Figure 10:
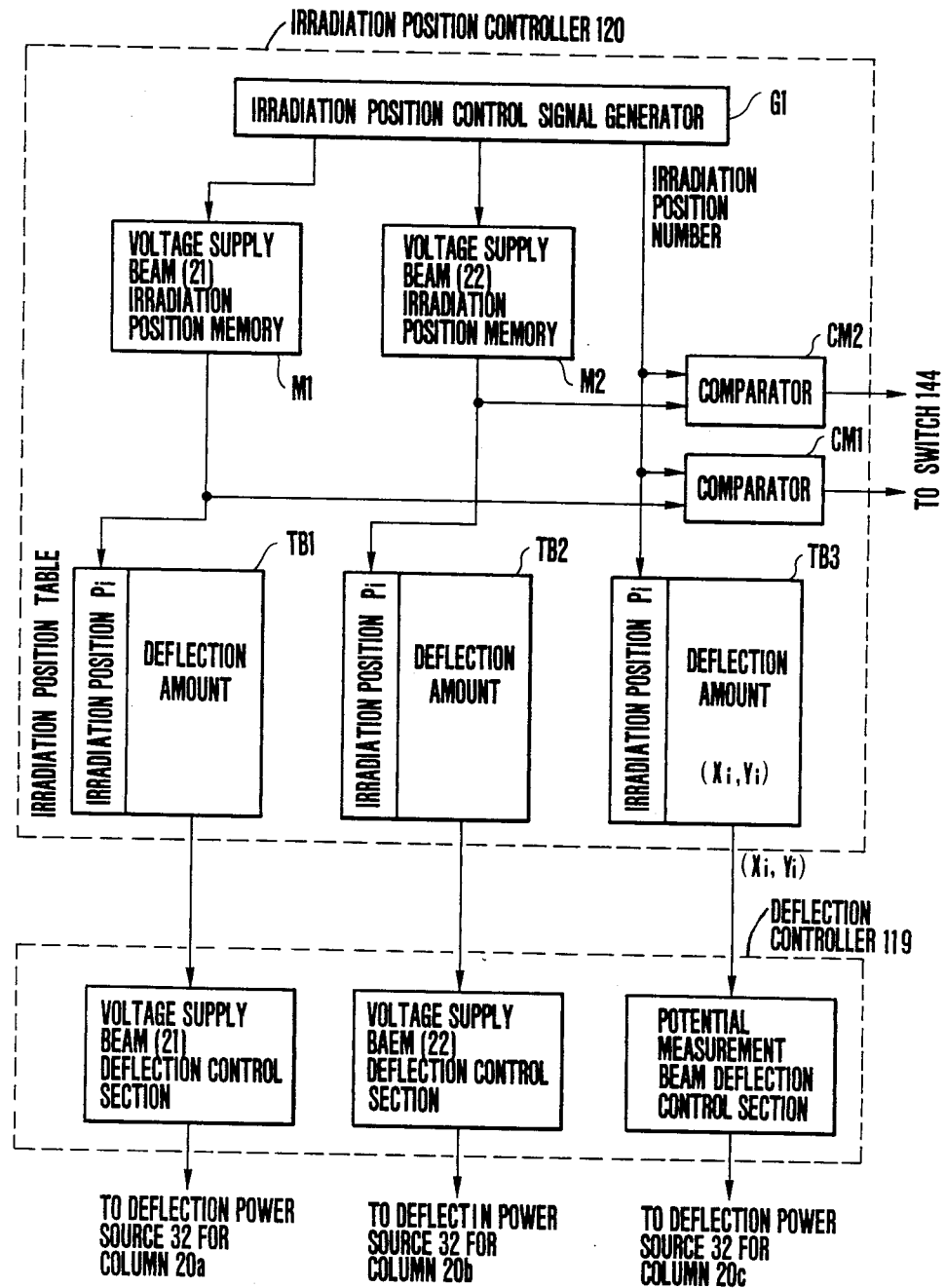
FIG. 10 is a detailed block diagram of an irradiation position controller and a deflection controller used in the apparatus shown in FIG. 9.

The beam irradiation positions are controlled by changing a deflection voltage. This control is performed by a deflection controller 119 and an irradiation position controller 120. FIG. 10 shows the arrangements of the controllers 119 and 120. The irradiation position controller 120 includes an irradiation position control signal generator G1 for specifying the irradiation positions of the respective beams, memories M1 and M2 for storing or prestoring the irradiation positions of the voltage supply beams 21 and 22, comparators CM1 and CM2 for detecting that the irradiation position of the beam 23 is the same as those of the beams 21 and 22, and tables TB1, TB2, and TB3 of deflection amounts at the irradiation positions irradiated with the respective beams during measurement. In each table, a deflection amount for an irradiation position number $p_i$ (i is a variable for identifying an irradiation position; $p_i = 1, 2, \ldots$) is defined as $(x_1, y_1)$ The irradiation position number $p_i$ is common to the respective beams, and represents the same value when the irradiation position is the same. The irradiation position control signal generator G1 generates the irradiation position numbers $p_i$ in order to specify the irradiation positions of the respective beams, and generates the deflection amounts corresponding to the irradiation positions based on the tables TB1, TB2, and TB3, thus supplying them to corresponding beam deflection control sections in the deflection controller 119. Note that the deflection amounts are supplied to the deflection controller 119 from the tables TB1 to TB3 based on the irradiation position data stored in memories M1 and M2. The deflection controller 119 sets signal values necessary for deflection to deflection power sources 32 corresponding to columns 20a to 20c in accordance with radiation conditions of the respective beams (e.g., an acceleration voltage). The irradiation position specifying signal of the potential measuring beam 23 is compared with the irradiation position specifying signals of the voltage supply beams 21 and 22 by the comparators CM1 and CM2, respectively, and goes to HI (HIGH) level if a coincidence is found therebetween. The comparison result signals are supplied to the switch 144 for determining whether the potential is fed back to the beam controller 116 or 117 of the voltage supply beam 21 or 22. When the output signal from the comparator CM1 is at HI level, the switch 144 connects the output of the potential measuring circuit 39 to the beam controller 116 of the column 20a. When the output signal from the comparator CM2 is at HI level, the switch 144 connects the output of the potential measuring circuit 39 to the beam controller 117 of the column 20b. If both the outputs are at LOW level, the output from the potential measuring circuit 39 is not fed back to the beam controllers 116 and 117. With the above procedures, the switching operation to the beam controllers is performed.

FIG. 11 is a timing chart of the above-mentioned control procedures. FIG. 11a shows the blanking state of the potential measuring beam 23, which is turned on and off at a constant frequency from the pulse controller 139. FIG. 11b shows connection of the switch 143 in the secondary electron detection circuit 114. The switch 143 switches between the holding circuit 40 and the differential amplifier 41 in synchronism with the signal shown in FIG. 11a. With this operation, a secondary electron signal Sc based on the potential measuring beam 23 is detected from the difference between the secondary electron signals corresponding to the ON and OFF states of the beam 23. Since the signal shown in FIG. 11b is effective during the ON time of the beam 23, the gate signal generator 145 generates a gate signal during the on time of the beam 23, as shown in FIG. 11c, and the gate signal is input to the sample-hold circuit 146 through a delay circuit 141 shown in FIG. 7. Then, the potential measuring circuit 39 measures the potential from the output from the circuit 146. The waveform shown in FIG. 11c indicates the gate signal supplied from the gate signal generator 145 to the sample-hold circuit 146 shown in FIG. 7 through the delay circuit 141. Based on this gate signal, the sample-hold circuit 146 samples and holds the output from the differential amplifier 41. The held value in the circuit 146 is supplied to the potential measuring circuit 39.

Meanwhile, deflection of the potential measuring beam 23 is performed by controlling a deflection voltage by the deflection controller 119 in accordance with the specified irradiation positions from the irradiation position controller 120. FIG. 11d shows the irradiation position specifying signal for specifying the irradiation position of the potential measuring beam 23, which is sequentially changed to correspond to irradiation positions P1, P2, and P3. Assume that the irradiation positions of the voltage supply beams 21 and 22 are given by P1 and P2. In the irradiation position controller 120, the irradiation position specifying signal of the beam 23 is compared with the irradiation position specifying signals of the voltage supply beams 21 and 22 by the comparators CM1 and CM2. The outputs from the comparators CM1 and CM2 go to HI level when the irradiation positions of the beams 21 and 22 coincide with that of the beam 23, as shown in FIGS. 11e and 11f. Based on these signals, the switch 144 determines which of the beam controllers 116 and 117 receives the potential measured result or whether the measured result is not supplied thereto. Upon this switching operation, the potential is fed back to the beam controller 116 or 117 and the potential at the irradiation position of the voltage supply beam 21 is controlled to be equal to a predetermined value.

With the above procedure, voltage setting at the irradiation positions P1 and P2 and potential measurement at the irradiation position P3 can be performed. Note that in FIG. 11, beam deflection is switched for every three ON/OFF operations of the beam. However, the number of the beam ON/OFF operations can be increased and an averaged potential can be fed back to the beam controller 116 to prevent an erroneous operation caused by noise components. The irradiation position specifying signal is also supplied to a signal processor 42, and is used for analysis and display of the measured potential, in other words, for discriminating whether or not the measured potential corresponds to that at the irradiation position.

Next, a measurement procedure and a test method of, e.g., drain current-drain voltage characteristics ($I_D-V_D$ characteristics), a threshold voltage, and the like of a transistor using the test apparatus of the present invention will be described. In a conventional method, a constant drive voltage ($V_D$) is applied to a drain wiring portion D, and a voltage ($V_G$) applied to a gate wiring portion G is changed. Then, a current ($I_D$) flowed through a load resistor R at that time is measured to obtain the $I_D-V_D$ characteristics and the threshold value of the transistor. Alternatively, the voltage $V_D$ is changed while maintaining the voltage $V_G$ constant to measure the $I_D-V_D$ characteristics. In this case, application of the voltages $V_D$ and $V_G$ and measurement of the current $I_D$ are performed by a contact method in which a power source is connected to an external terminal of the transistor to be measured.

Figure 12A:
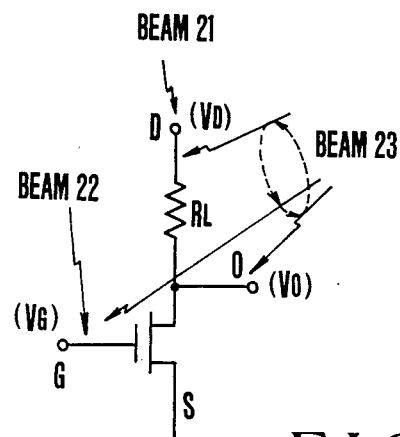
FIGS. 12A and 12B are a circuit diagram and a sectional view of an electronic device to be measured.
Figure 12B:
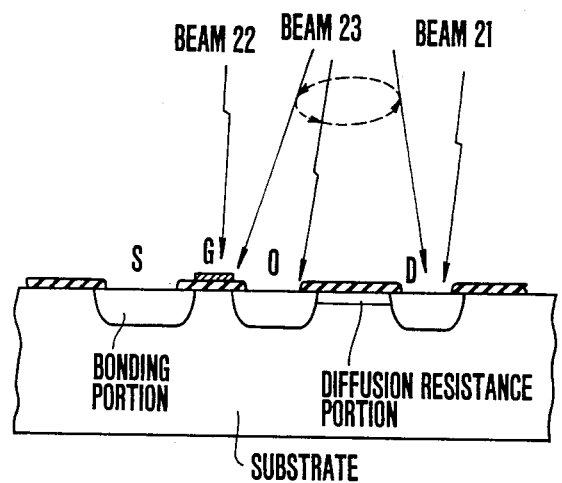

However, during the manufacture of the transistor, these procedures must be performed in a non-contact manner. The apparatus of the present invention is used in such noncontact measurement. FIGS. 12A and 12B show beam irradiation positions (potential measuring positions) on a transistor as a device to be measured. In this case, a diffusion resistor is used as a load resistor, but an inverter circuit having a transistor as a load resistor can be used.

A measurement procedure of $I_D-V_D$ characteristics as one of electrical characteristics of the transistor will be explained below. First, drain and gate voltages are initially set at $V_{DD}$ and $V_{DG}$. The voltage supply beam 22 is radiated on a gate wiring portion G, and the voltage supply beam 21 is radiated on a drain wiring portion D. At the same time, the potential measuring beam 23 is sequentially radiated on the drain wiring portion D, the gate wiring portion G, and an output wiring portion 0, thus measuring respective potentials $V_D$, $V_{Gk}$, and $V_O$, and setting the potentials of the portions D and G at a predetermined value. When the beam 23 is radiated on the drain wiring portion D, a beam current of the beam 21 is controlled by the beam controller 116, so that the potential of the portion D is equal to and fixed at the value $V_{DD}$. When the beam 23 is radiated on the gate wiring portion G, a beam current of the beam 22 is controlled by the beam controller 117, so that the potential of the portion G is equal to and fixed at the value $V_{DG}$. When the potentials at the respective irradiation positions are equal to the set values, the potential $V_O$ is measured and the potentials $V_D$, $V_G$, and $V_O$ are then stored in a memory in the signal processor 42. Thereafter, the value $V_{DD}$ is sequentially changed while keeping the value constant, and the above measurement is repeated to store the respective potentials $V_D$, $V_G$, and $V_O$. When the value $V_{DD}$ reaches a certain value, measurement is ended. At this time, beam radiation is stopped or beam radiation for the next irradiation positions is started. Next, $V_{12}=V_D-V_O$ is calculated from the storage values, and a drain current $I_D$ is obtained from $I_D=V_{12}/R$. In this case, design values obtained by simulation can be used for the resistance R. From this calculation, the currents $I_D$ for the respective voltages $V_D$, and the $I_D-V_D$ characteristics are then displayed.

$I_D-V_G$ characteristics can be similarly measured. In this case, the value $V_{DG}$ is changed while keeping the value $V_{DD}$ constant, and the above-mentioned measurement is repeated. Although the $V_{DD}$ is constant, when the gate voltage is changed, a current flowed through a channel is changed. For this reason, a beam current for keeping the voltage $V_D$ at $V_{DD}$ changes. Therefore, the voltage supply beam 21 must be controlled as well as the beam 22. In this manner, measurement is repeated until the value $V_{DG}$ has reached a certain value. At this time, beam radiation is stopped or beam radiation for the next irradiation positions is started. Next, $V_{12}=V_D-V_O$ is calculated from the storage values, and a drain current $I_D$ is obtained from $I_D=V_{12}/R$, thereby measuring the $I_D-V_G$ characteristics. From the $I_D-V_G$ characteristics, a threshold value can be obtained.

Note that the irradiation positions need not always be points. For example, voltage supply or potential measurement can be performed by planar scanning around the points so as not to fall outside the wiring. This can advantageously average a potential in an irradiation region.

Figure 13:
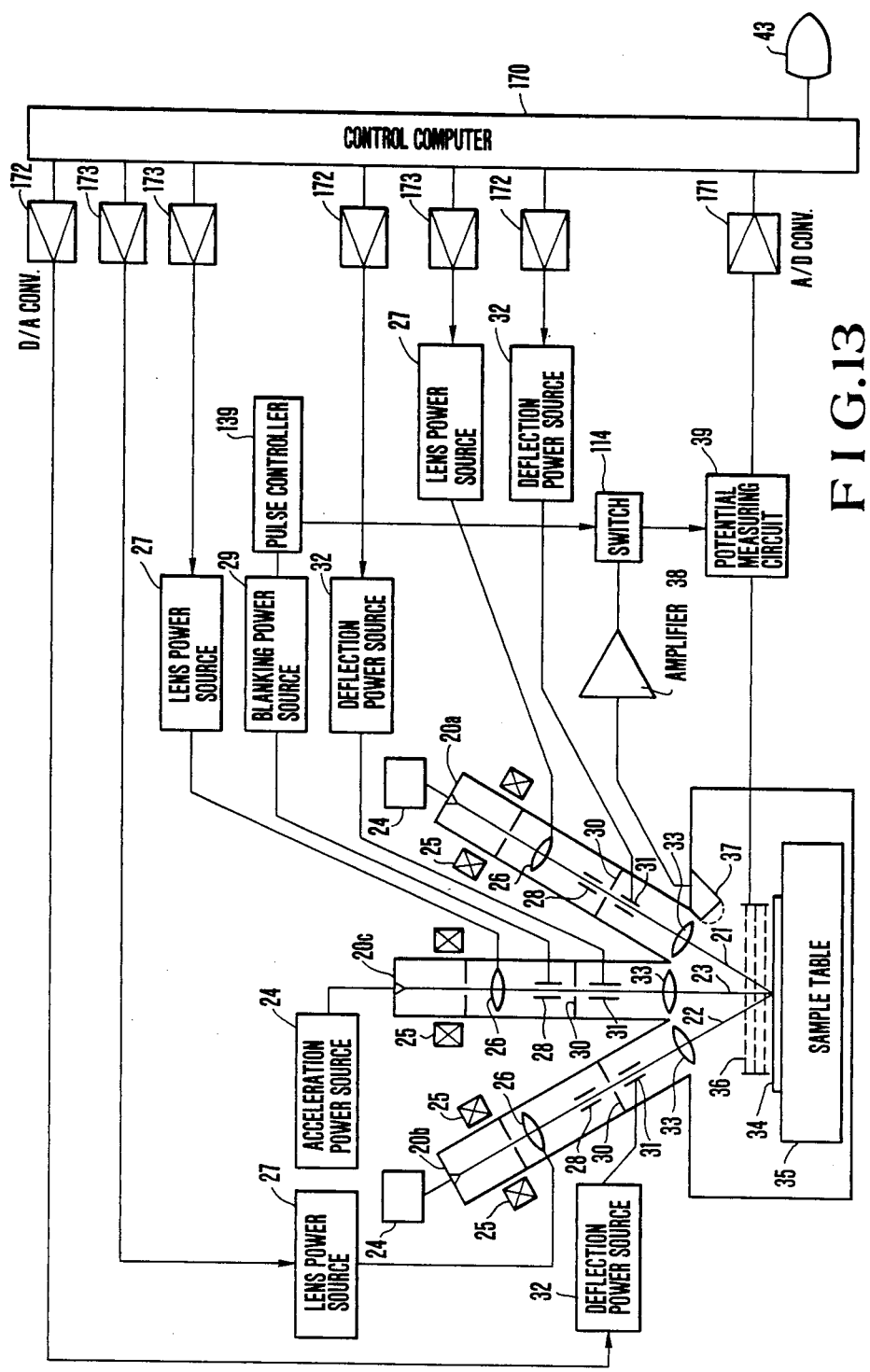
FIG. 13 is a diagram of still another embodiment of a characteristic test apparatus of the present invention.
Figure 14:
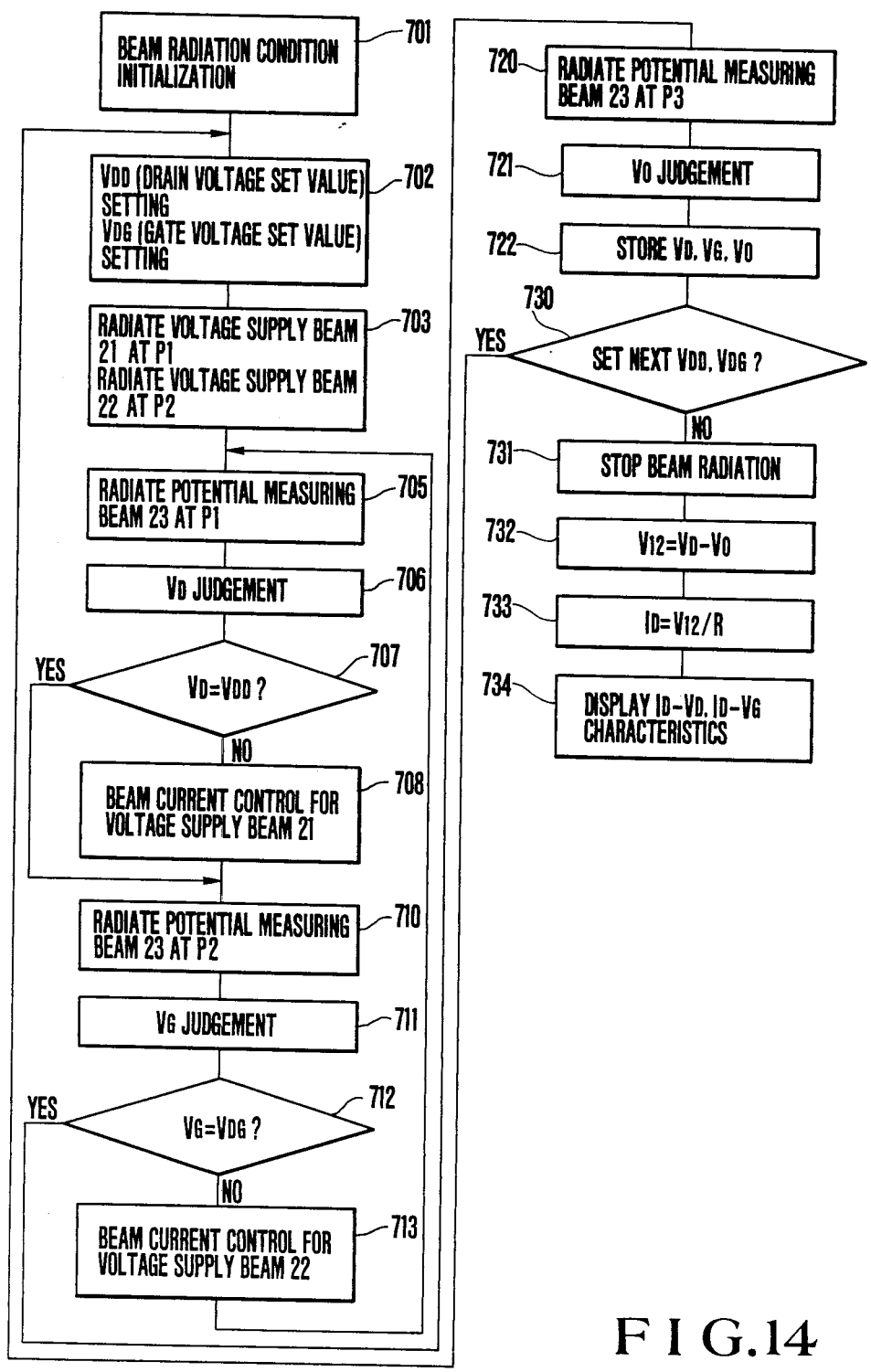
FIG. 14 is a flow chart for explaining the operation of the apparatus shown in FIG. 13.

FIG. 13 shows still another embodiment of a characteristic test apparatus of the present invention, in which the control operation in the previous embodiments is performed by a control computer 170. An output from a potential measuring circuit 39 is supplied to the computer 170 through an A/D converter 171, thus fetching a potential therein. The computer 170 controls deflection voltages of respective beams using D/A converters 172, thus setting irradiation positions. D/A converters 173 control lens voltages, thereby increasing or decreasing the beam currents. FIG. 14 shows a control procedure of this embodiment. Note that the following description is made using the transistor circuit shown in FIGS. 12A and 12B. First, beam radiation conditions are initialized in step 701 in the same manner as in the previous embodiments. In step 702, voltage set values of positions P1 and P2, i.e., the drain and the gate irradiated with voltage supply beams 21 and 22, are respectively set at $V_{DD}$ and $V_{DG}$. Then, the flow advances to step 703, and the beams 21 and 22 are radiated onto the positions P1 and P2. The flow then advances to step 705, and a potential measuring beam 23 is radiated onto the position P1. The flow advances to step 705 for $V_D$ measurement. During this measurement, if it is detected in step 707 that the potential $V_D$ is not equal to the value $V_{DD}$, the flow advances to step 708, and the computer 170 supplies a control signal to a lens power source 27 corresponding to the beam 21 through the D/A converter 173, thereby controlling (increasing or decreasing) a beam current of the beam 21. If the potential $V_D$ is equal to the value $V_{DD}$, the lens power source 27 is controlled to maintain the beam current. The flow then advances to step 710, and the potential measuring beam 23 is radiated onto the gate P2. In step 711, the potential $V_G$ is measured. If it is detected in step 712 that the potential $V_G$ is not equal to the value $V_{DG}$, the computer 170 supplies a control signal to a lens power source 27 corresponding to the beam 22 through the D/A converter 173, thereby controlling (increasing or decreasing) a beam current of the beam 22. The flow returns to step 705, and potential measurement of the drain P1 is started.

If it is detected in step 712 that the potential $V_G$ is equal to the value $V_{DG}$, the flow advances to step 720, and the beam 23 is radiated onto the output wiring portion P3. In step 721, the potential $V_O$ is measured, and the potentials $V_D$, $V_G$, and $V_O$ are stored in a memory of the computer 170. The flow advances to step 730 to discriminate if the next value: $V_{DD}$ and $V_{DG}$ values are to be set. If the new values $V_{DD}$ and $V_{DG}$ are to be set, the flow returns to step 702, and setting of the values $V_{DD}$ and $V_{DG}$ is performed; otherwise, t e flow advances to step 731, and beam radiation is stopped. The flow advances to step 732 to calculate $V_{12} = V_{Dp31}$ $V_O$ and $I_D = V_{12}/R$ is calculated in step 733. In step 734, $I_D - V_D$ or $I_D - V_G$ characteristics are displayed on a display device 43.

In the above embodiment, the lens power source voltage is changed to change a beam current. However, a Wehnelt voltage of an electron gun can also be changed. A secondary electron signal can be input directly to the computer through an A/D converter without using the potential measuring circuit, so that the signal (Sa+Sb) is subtracted therefrom to calculate the signal Sab, thereby obtaining a potential therefrom. In this case, the control computer 70 controls the blanking voltage using a D/A converter to perform a blanking operation of the potential measuring beam.

According to the embodiments shown in FIGS. 6 to 14, a plurality of beams are radiated onto an electronic device, and a secondary electron signal based on a potential measuring beam is detected from the secondary electron signals generated from a plurality of irradiation positions. Therefore, the potential at the irradiation position of the potential measuring beam can be measured while radiating a plurality of beams at the same time. The potential measured result by means of the potential measuring beam is fed back to beam controllers for other beams (i.e., voltage supply beams for setting potentials at irradiation positions), so that the potentials at the irradiation positions are equal to set values. Thus, non-contact voltage supply can be performed unlike in a conventional test apparatus, which requires voltage supply through an external terminal. Even if radiation conditions of the voltage supply beams are changed to set potentials, potential measurement can be accurately performed. Therefore, quantitative measurement of a current leakage, capacitance and its voltage dependency, the threshold voltage of a transistor, drain current-drain voltage characteristics of a transistor, and the like, and inspection of an electronic device can be performed during its manufacturing period.

In the embodiments shown in FIGS. 6 to 14, a voltage applied to a grid of the energy analyzer 36 is adjusted, so that the secondary electron signal supplied from the secondary electron signal detection circuit 114 is equal to a preset reference secondary electron signal (e.g., a secondary electron signal when a potential is at 0 V) S0, and a potential is measured with reference to the adjusted value. At this time, measurement is performed while the reference secondary electron signal S0 is assumed to be constant. However, since the reference secondary electron signal S0 differs in accordance with materials, beam currents, and the like, errors will occur during potential measurement when materials are different at the respective irradiation positions, or when a beam current is changed to set the potential at the irradiation position to the target voltage $V_R$ FIGS. 15 and 16 are arrangements for eliminating such errors.

Figure 15:
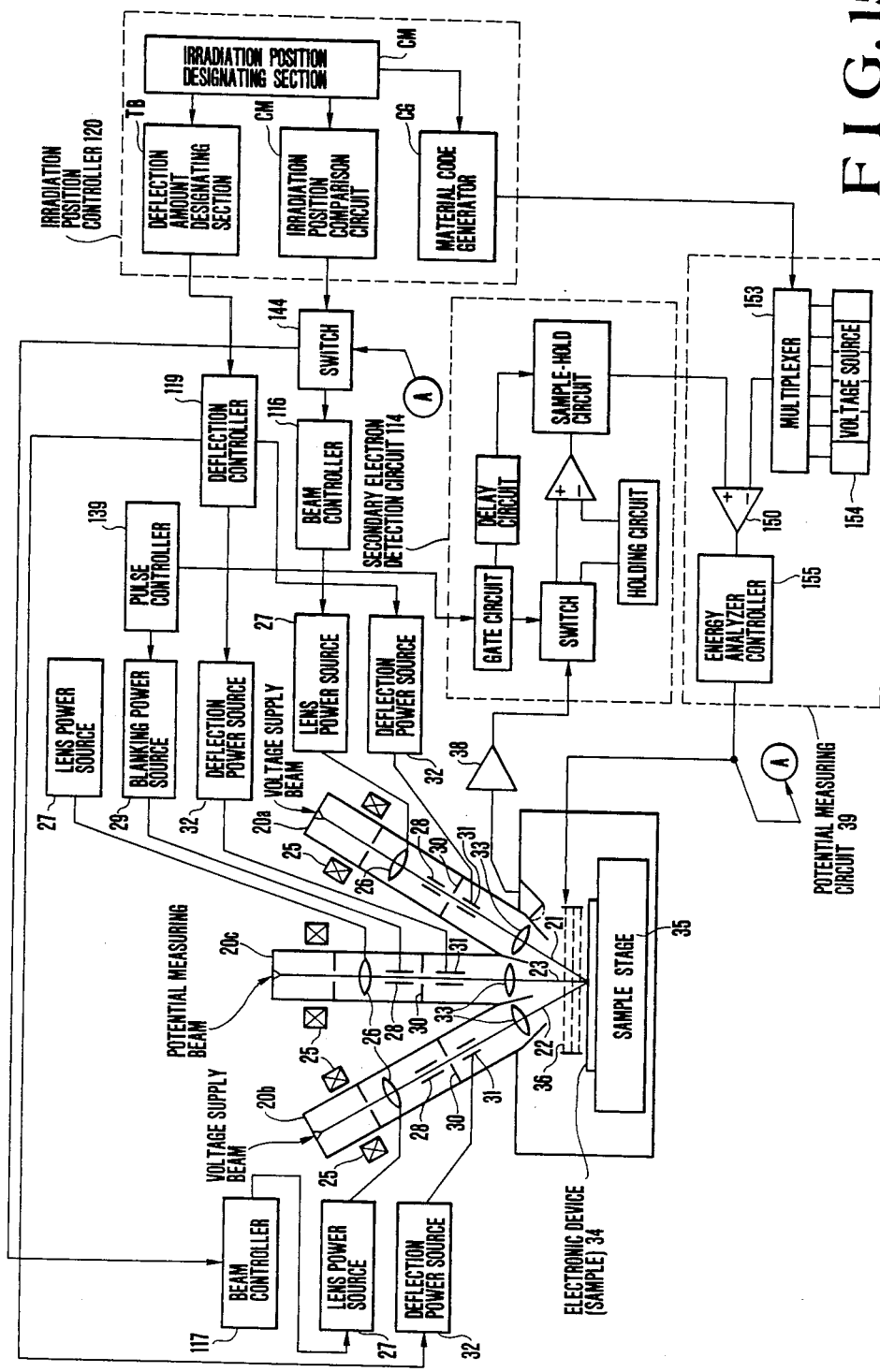
FIGS. 15, 16, and 17 are diagrams of still other embodiments of characteristic test apparatuses of the present invention.
Figure 16:
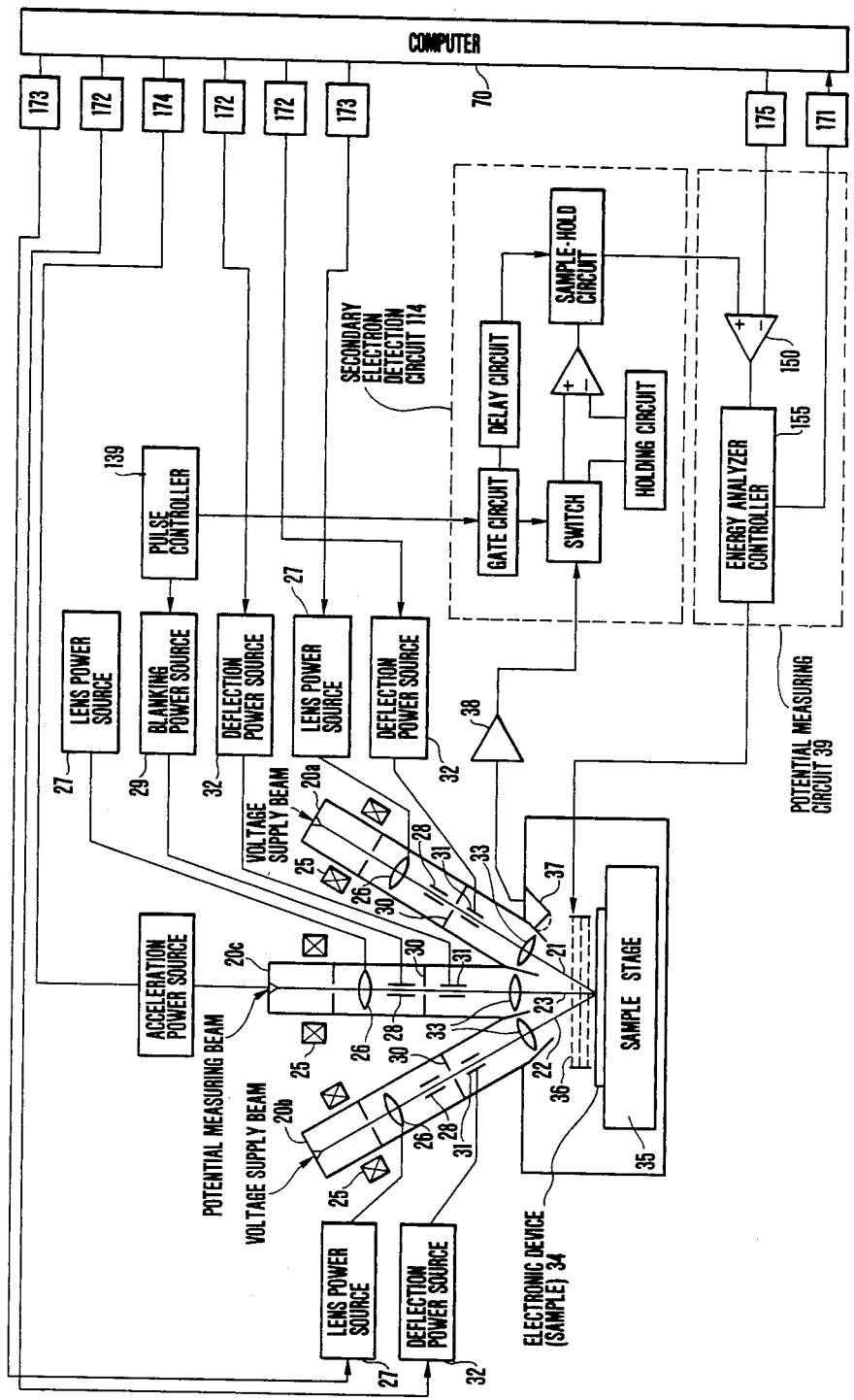

Note that the same reference numerals in FIG. 15 denote the same parts as in FIG. 6. Referring to FIG. 15, an irradiation position controller 120 designates a deflection amount to a deflection controller 119 in accordance with a beam irradiation position, in the same manner as described above. In the deflection controller 119, a voltage applied to a deflection power source 32 is changed in accordance with the designated deflection amount, thereby changing the irradiation position. The irradiation position controller 120 has a material code generating section CG storing materials at irradiation positions with reference to design data, and the like in the form of a table. More specifically, a table in which deflection amounts and surface materials are preset for the respective irradiation positions is prepared. Thus, the controller 120 designates the deflection amount to the deflection controller 119, and supplies a material designation signal to a potential measuring circuit 39.

The irradiation position controller 120 will be described hereinafter in more detail. The irradiation position controller 120 comprises an irradiation position designating section GI for designating the irradiation positions of the respective beams, an irradiation position comparison circuit CM for generating a signal to check if the irradiation position of the voltage supply beam coincides with that of the potential measuring beam, a deflection amount designating section TB for designating the deflection amounts at the irradiation positions irradiated with the respective beams to the deflection controller 119, and the material code generating section CG for specifying the material at the irradiation position. These components are set using the table. For example, a deflection amount for an irradiation position number $p_i$ (i is a variable for discriminating the irradiation positions; $p_i = 1, 2, \ldots$) is stored as $(x_1, y_1)$ and a material code is stored as $m_i$ in the form of a table. The irradiation position number $p_i$ is common to the respective beams. When the irradiation positions are the same, the number $p_i$ has the same value. The irradiation position designating section GI generates an irradiation position number $p_i$ for designating the irradiation position for each beam. The deflection amount corresponding to the designated irradiation position is generated by the deflection amount designating section TB on the basis of the table, and is supplied to the deflection controller 119. The controller 119 sets a signal value necessary for deflection to the deflection power source 32 in accordance with radiation conditions e.g., an acceleration voltage of each beam. In this case, for the obliquely radiated beams, deflection amount correction is performed in accordance with their incident angles to set the signal values for the power sources 32. The irradiation position designating signal for the potential measuring beam 23 is compared with those of the voltage supply beams 21 and 22 by the irradiation position comparison circuit CM using two comparators as in the previously mentioned embodiment, and if a coincidence therebetween is found, the output signals from the comparators go to HI level. The outputs from the circuit CM are input to a switch 144 for selectively feeding back the potential to beam controllers 116 and 117 for the voltage supply beams. When an output signal from one comparator in the circuit CM is at HI level, the switch 144 connects the output from the potential measuring circuit 39 to the beam controller 116 for a column 20a. When an output from the other comparator is at HI level, the switch 144 connects the output of the potential measuring circuit 39 to the beam controller 117 for a column 20b. When both the output signals are at LOW level (zero), the output of the potential measuring circuit 39 is not fed back to the beam controllers 116 and 117. With the above procedure, the switching operation with respect to the beam controllers 116 and 117 is performed.

The material code signal is used for switching a multiplexer 153 in the potential measuring circuit 39, i.e., for changing the reference secondary electron signal in accordance-with materials. The material code signal is coded; such as 1 for aluminum, 2 for polysilicon, and so on. The material code signal is input to the multiplexer 153 in the potential measuring circuit 39 to specify its channel. The respective channels of the multiplexer 153 are connected to voltage sources 154 for generating reference voltages corresponding to materials, e.g., aluminum, polysilicon, and the like. When a channel is selected, a value corresponding to the selected channel is input to a differential amplifier 150 as a reference secondary electron signal and is compared with the measured secondary electron signal. Then, an energy analyzer controller 155 is controlled so that the reference secondary electron signal coincides with the measured secondary electron signal, thus setting a potential. With this arrangement, potential measurement can be performed with high precision in accordance with different reference secondary electron signal values for the respective irradiation positions, even if materials are different at the respective irradiation positions and their S curves are varied. Note that in an arrangement wherein potential measurement is performed using the potential measuring beam 23 and the measurement result is fed back to the voltage supply beams 21 and 22, if the beam current of the potential measuring beam 23 is kept constant, the reference secondary electron signal need not be changed when the beam currents of the voltage supply beams 21 and 22 are changed to control the potentials at the irradiation positions. In this embodiment, the same secondary electron detection circuit 114 as that shown in FIG. 7 is used, and a detailed description thereof is omitted.

FIG. 16 shows still another embodiment of a characteristic test apparatus of the present invention, in which a control computer 170 directly sets a voltage corresponding to a reference secondary electron signal of a potential measuring circuit using a D/A converter 175. The reference numerals in FIG. 16 denote the same parts as in FIG. 15. The computer 170 causes D/A converters 173 to set the voltages of lens power sources 27 for changing beam currents, D/A converters 172 to set the values of deflection power sources 32 for changing irradiation positions, and a D/A converter 174 to set the voltage of an acceleration power source 24. In addition, a reference voltage of a potential measuring circuit 39 is set by the D/A converter 175. At this time, a reference voltage Vp is given by kIp, where Ip is a beam current and k is a constant determined by an acceleration voltage and a material. The values of k corresponding to materials (e.g., aluminum, polysilicon, etc.) and acceleration voltages are prestored in the form of a table. Alternatively, in materials used for metal wirings of an LSI, a secondary emission ratio exhibits its peak value at an acceleration voltage of several hundreds of volts and, thereafter, is decreased as the acceleration voltage decreases. Therefore, the values of k can be determined in accordance with the curve of this function. The control computer 170 has a table for determining the lens voltage corresponding a given value of the beam current by the D/A converter 173. Although the beam irradiation position is set by the D/A converter 172, a material at that portion can be known from design data. Therefore, the value of k can be determined when the D/A converters set the irradiation position and the acceleration voltage. In addition, the beam current is also determined when the lens voltage is set. Thereafter, a product of the irradiation position and the beam current is calculated and is set through the D/A converter 175.

In the secondary electron detection circuits shown in FIGS. 15 and 16, a frequency component of a potential measuring beam is derived using a holding circuit and a switch, but can be derived using a high-pass filter, as described with reference to FIG. 8.

Figure 17:
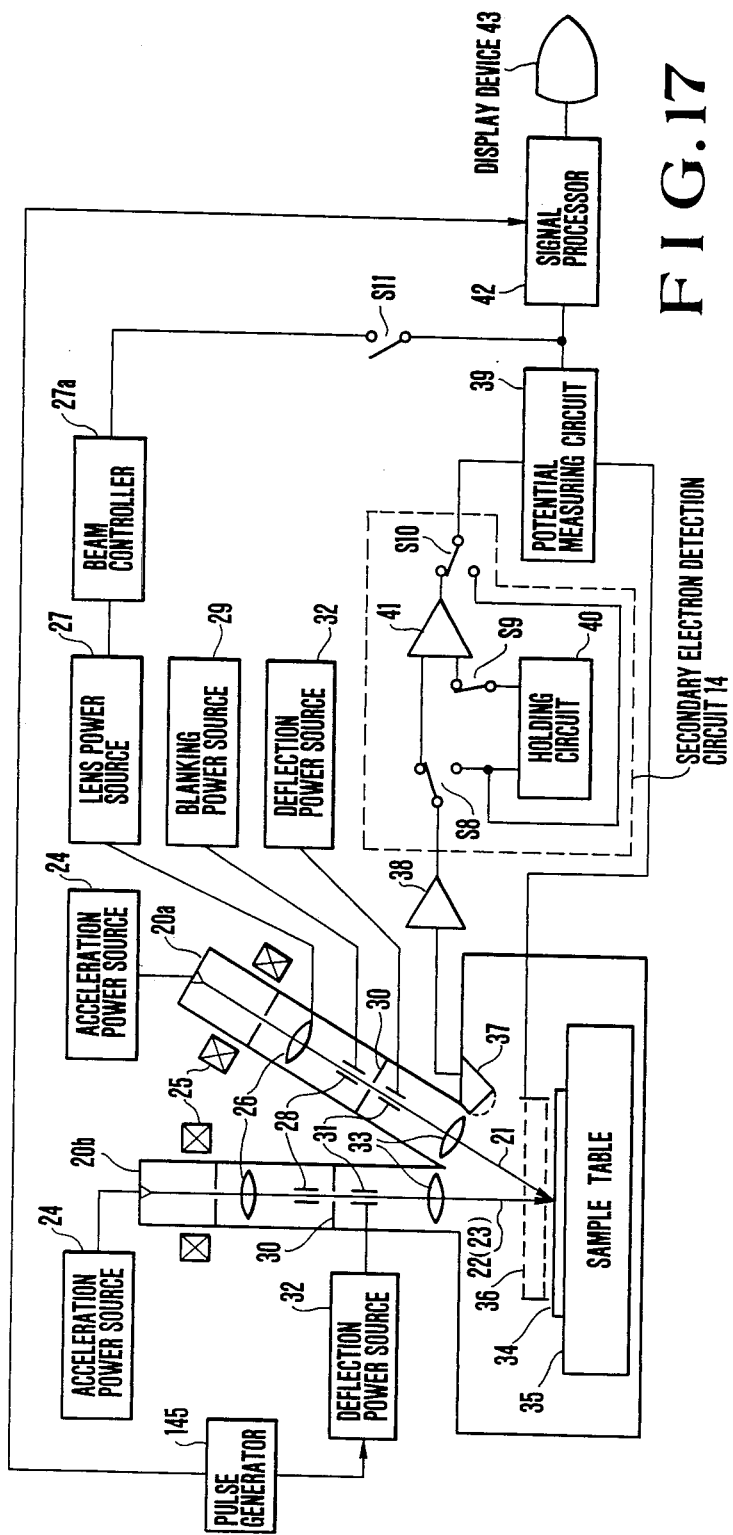

FIG. 17 shows still another embodiment of a characteristic test apparatus of the present invention, in which a single column 20b serves both as the columns 20b and 20c in FIG. 11, in other words, a single beam is used for both a voltage supply beam 22 and a potential measuring beam 23. The same reference numerals in FIG. 17 denote the same parts or functional blocks as in FIG. 11. Referring to FIG. 17, a charged beam 22 (or 23) emitted by a column 20b is accelerated by an acceleration power source 24, and is radiated onto a plurality of irradiation positions on an electronic device 34 placed on a sample table 35.

When a potential at a first irradiation position P1 is to be set by a charged beam 21, the movable contacts of switches S8 and S10 are connected to the corresponding stationary contacts at the holding circuit 40 side, respectively, so that an output from an amplifier 38 is input to a holding circuit 40 and a potential measuring circuit 39. In addition, a switch Sll is closed, so that an output from the potential measuring circuit 39 is also connected to a beam controller 27a.

When potentials at second and third irradiation positions P2 and P3 are to be measured, the output from the amplifier 38 is input to a differential amplifier 41, and a difference between the outputs from the amplifier 38 and the holding circuit 40 is input to the potential measuring circuit 39. At this time, the output from the potential measuring circuit 39 is not connected to the beam controller 27a for controlling the beam current. The charged beam 22 is used for both voltage supply to the second irradiation position P2 and potential measurement at the third irradiation position P3. For this reason, since the beam emitted by the column 20b is alternately radiated to the second and third irradiation positions, a deflection power source for the beam 22 (23) receives and amplifies pulses generated by a pulse generator 45. In this case, high-frequency pulses are used. These pulses have a repetitive frequency high enough to prevent a decrease in potential at the second irradiation position when the charged beam is radiated on the third irradiation position P3, and cause an irradiation time at the second irradiation position to be prolonged and that at the third irradiation position to be shortened in order to supply the voltage to the second irradiation position. Immediately after the potential measurement at the third irradiation position P3 ends, the charged beam is deflected toward the second irradiation position. The output from the pulse generator 45 is also input to a signal processor 42 together with the output (voltage) from the potential measuring circuit 39, and is used for separately detecting the potentials at the second and third irradiation positions. More specifically, the output voltage from the pulse generator 145 can be binarized as to whether a beam is radiated on the second or third irradiation position. For example, the voltage from the pulse generator 45 can be a "0" binary signal for the second irradiation position and a "1" binary signal for the third irradiation position. When the output from the potential measuring circuit 39 is measured in synchronism with the "0" and "1" signals, the potentials at the second and third irradiation positions can be separately measured.

Figure 18:
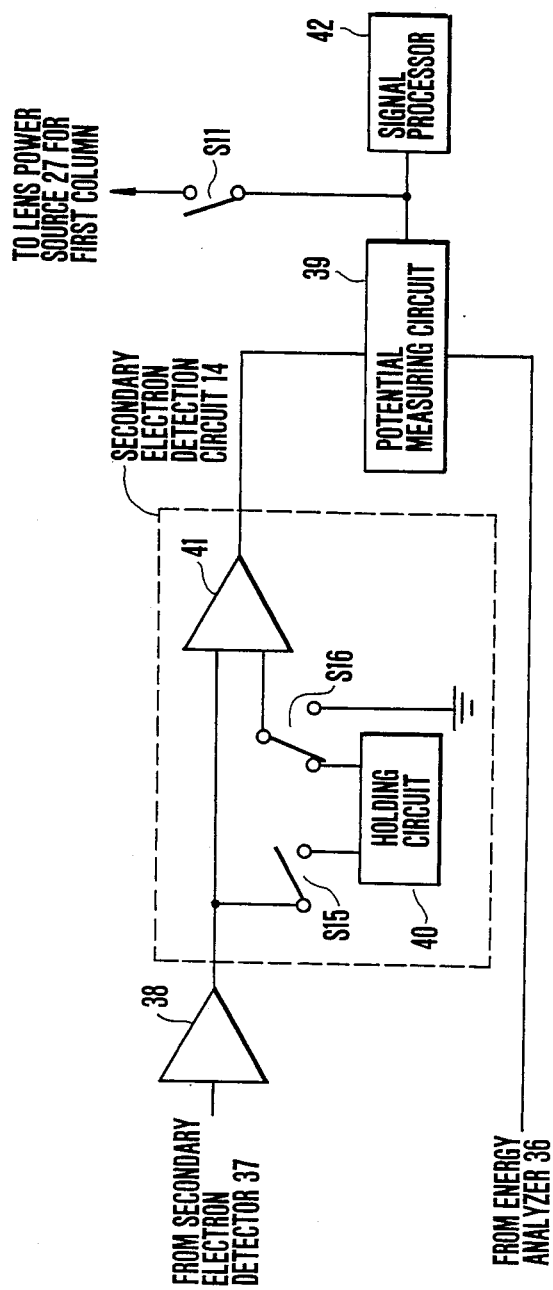
FIG. 18 is a circuit diagram of a secondary electron detection circuit used in the apparatus shown in FIG. 17.

It should be noted that the present invention is not limited to the above embodiments, and various changes and modifications may be made within the spirit and scope of the invention. For example, the differential amplifier 41 in the secondary electron detection circuit 14 in the embodiment in FIG. 1 has a unity gain. However, if the gain of the differential amplifier 41 is not unity, since a signal is input from the amplifier 38 directly to the potential measuring circuit 39 by means of the switches S10 and S8 during potential setting, another amplifier having the same gain as that of the differential amplifier 41 can be inserted between the amplifier 38 and the potential measuring circuit 39. Alternatively, as shown in FIG. 18, a switch S15 is connected to the holding circuit 40 and a switch S16 is connected to a ground potential during potential setting, so that the differential amplifier 41 receives the output signal from the amplifier 38 and the ground potential. When the second beam is turned on, the output of the holding circuit 40 is switched by the switch S16 to be connected to the differential amplifier 41. More specifically, during potential setting, the output of the amplifier 38 is input to the holding circuit 40, and the output from the holding circuit 40 is not connected to the differential amplifier 41. During potential measurement, the output of the amplifier 38 is disconnected from the holding circuit 40 and the output of the holding circuit 40 is input to the differential amplifier 40. The switching operations of the switches S15 and S16 are interlocked with that of the switch S11 for selectively feeding back the output of the potential measuring circuit 39 to the beam controller 27a.

What is claimed is:

1. A characteristic test apparatus for an electronic device comprising:
    a. first charged beam radiating means for irradiating with a first charged beam a first position of the electronic device placed on a sample table;
    b. second charged beam radiating means for irradiating with a second charged beam a second position of the electronic device different from the first position;
    c. third charged beam radiating means for irradiating with a third charged beam a third position of the electronic device different from the first and second positions;
    d. a secondary electron detection circuit for detecting secondary electrons generated from the respective irradiated positions of the electronic device and potential measuring means for performing a feedback to an analysis voltage of an energy analysis electrode between said electronic device and a secondary electron detector such that an output from said secondary electron detection circuit is equal to a reference signal output wherein the analysis voltage is changed to negative and positive values when the output from said detector is larger and smaller than the reference signal, respectively, and for measuring a potential from the analysis voltage;
    e. first charged beam radiation control means for receiving an output result of said potential measuring means, comparing the received output result with a first set potential value, and controlling said first charged beam radiating means;
    f. second charged beam radiation control means for receiving the output result of said potential measuring means, comparing the output result with a second set potential value, and controlling said second charged beam radiating means; and
    g. a switching circuit operated such that the output from said potential measuring means is connected to said first charged beam radiation control means when the second charged beam is off and only the first charged beam is on, that the output of said potential measuring means is connected to said second charged beam radiation control means when the first charged beam if on and the second charged beam is on, and that the output from said potential measuring means is connected to neither said first nor second charged beam radiation control means when the third beam is off, and means for receiving the output from said potential measuring means when the third beam is on and determining the characteristics of the electronic device from a relationship between any one of the first and second set potential values and the potential at the third position irradiated with the third charged beam.

2. An apparatus according to claim 1, wherein said first and second charged beam radiation control means have beam control means for decreasing and increasing beam currents when absolute values of the values of the potentials measured by said potential measuring means are larger and smaller than an absolute value of a set potential value, respectively.

3. An apparatus according to claim 1, wherein said secondary electron detection circuit comprises:
    a. a holding circuit for storing a secondary electron signal output when the third beam is off;
    b. a subtracting circuit for detecting the difference between the secondary electron signal output and the output of said holding circuit when the third beam is on, and
    c. a switching circuit for transmitting the output of a secondary electron detector to said holding circuit in synchronism with the turning on and off of the third beam.

4. An apparatus according to claim 1, wherein the first and second charged beams are pulse beams, and said first and second charged beam radiation control means have pulse control means for changing a ratio of pulse on/off time intervals by decreasing and increasing the pulse on time intervals when the absolute values of the values of the potentials measured by said potential measuring means are larger and smaller than the absolute value of the set potential value, respectively.

5. An apparatus according to claim 1, wherein said potential measuring means additionally comprises:
    means for altering the reference signal amount used by said potential measuring means at the time of measuring the potentials at the first, second and third positions depending on the materials of the first, second, and third positions irradiated and variation of the acceleration voltages of the first, second and third beams, and means for altering the reference signal output in accordance with the beam currents of the first, second, and third beams.

6. An apparatus according to claim 1, wherein said means for determining the characteristics of the electronic device determines the ID-VG characteristics or a transistor threshold value from the variation in an output of said transistor that corresponds to the potential at the third position with respect to the potential of a gate that corresponds to the second position while the potential of a drain of said transistor that corresponds to the first position is fixed.

7. A characteristic test apparatus for an electronic device comprising:
   a. first charged beam radiating means for irradiating with a first charged beam a first position of the electronic device placed on a sample table;
   b. second charged beam radiating means for irradiating with a second charged beam a second position of the electronic device different from the first position;
   c. third charged beam radiating means for emitting a third charged beam which is pulsed at a predetermined frequency;
   d. a secondary electron detection circuit for detecting secondary electrons generated due to the irradiation with the third charged beam, and potential measuring means for performing feedback to a voltage of an energy analysis electrode between said electronic device and a secondary electron detector such that an output from said secondary electron detection circuit is equal to a reference signal output and for measuring a potential from the analysis voltage;
   e. first charged beam radiation control means for receiving an output result of said potential measuring means, comparing the output result with a first set potential value, and controlling said first charged beam radiating means;
   f. second charged beam radiation control means for receiving the output result of said potential measuring means, comparing the output result with a second set potential value, and controlling said second charged beam radiating means; and
   g. a switching circuit operated such that the output from said potential measuring means is connected to said first charged beam radiation control means when the third charged beam irradiates the same position irradiated with the first charged beam, that the output from said potential measuring means is connected to said second charged beam radiation control means when the third charged beam irradiates the same position irradiated with the second charged beam, and that the output from said potential measuring means is connected to neither said first nor said second charged beam radiation control means when the third charged beam irradiates a position different from those irradiated with the first and second charged beams, and means for receiving the output from said potential measuring means when the third beam is on and determining the characteristics of the electronic device from a relationship between any one of the first and second set potential values and the potential at the third position irradiated with the third charged beam.

8. An apparatus according to claim 7, wherein said secondary electron detection circuit comprises:
   h. a holding circuit for storing a secondary electron signal output of the time when the third beam is off;
   i. a subtracting circuit for detecting the difference between the secondary electron signal output and the output of said holding circuit when the third beam is on,
   j. a switching circuit for transmitting the output of said secondary electron detector to said holding circuit in synchronism with the turning on and off frequency of the third pulse beam, and
   k. a sample hold circuit for sampling and holding an output from said subtracting circuit which is output at the turning on and off frequency of the third pulse beam.

9. An apparatus according to claim 7, wherein said third beam has a pulse frequency and said secondary electron detection circuit and said potential measuring means comprise a high-frequency filter for transmitting the output of a secondary electron detector for detecting secondary electrons generated due to beam irradiation and for filtering the pulse frequency of the third beam, a circuit for detecting an amplitude of an output signal from said filter, and means for measuring a potential by controlling the analysis voltage such that the output signal from said filter is equal to a reference signal.

10. An apparatus according to claim 7, wherein said potential measuring means further comprises:
    means for altering the reference signal amount used by said potential measuring means depending on variation of the materials of the first, second, and third positions irradiated in accordance with a secondary electron emission of the materials, and means for altering the reference signal amount in accordance with the beam current of the third beam.

11. An apparatus according to claim 7, wherein said first and second charged beam radiating means each comprise an individual column.

12. An apparatus according to claim 7, wherein first and second charged beam radiation control means have control means for increasing and decreasing the acceleration voltage when the respective potential measured by said potential measuring means are larger and smaller than the set potential values, respectively.

13. An apparatus according to claim 7, wherein first and second charged beam radiation control means include beam control means for decreasing and increasing the beam current when an absolute value of the value of the potential measured by said potential measuring means is larger and smaller than an absolute value of a set potential value, respectively.

14. An apparatus according to claim 7, wherein first and second charged beam radiation control means include pulse control means for changing a pulse on/off time interval ratio by decreasing and increasing an on time interval when an absolute value of the value of the potential measured by said potential measuring means is larger and smaller than an absolute value of the set potential value, the first and second charged beams being pulse beams having lower frequencies than that of the third charged beam.

15. An apparatus according to claim 7, wherein said means for determining the characteristics of the electronic device determines the ID-VG characteristics from the variation in an output of a transistor that corresponds to the potential at the third position with respect to the potential of a gate that corresponds to the second position while the potential of a drain of said transistor that corresponds to the first position is fixed.

16. A characteristic test method for an electronic device comprising the steps of:
   a. radiating a first charged beam to a first position of the electronic device placed on a sample table, adjusting an analysis voltage to be applied to an energy analyzer between said electronic device and a secondary electron detector such that a detected secondary electron output is equal to a reference signal output, and measuring the potential at the first position from a shift in the analysis voltage wherein the analysis voltages are changed to negative and positive values when outputs from said detector are larger and smaller than the reference signal, respectively;
   b. controlling the condition of radiating the first charged beam so as to make the value of the potential at the first position equal to a first set objective potential value;
   c. radiating a second charged beam to a second position different from the first position of the electronic device while the first charged beam irradiates the first position of said electronic device, adjusting a second analysis voltage to be applied to the energy analyzer between said electronic device and said secondary electron detector such that a secondary electron signal output is radiated only when the first charged beam is equal to the reference signal amount, and measuring the potential at the second position from a shift in the analysis voltage;
   d. controlling the condition of radiating the second charged beam so as to make the value of the potential at the second position equal to the second set objective potential value;
   e. radiating a third charged beam to a third position of the electronic device different from the first and second positions and detecting secondary electrons generated upon radiation of the third charged beam to measure the potential at the third position of the electronic device; and
   f. sequentially changing and thus controlling the second set potential value to measure a relationship between the potential at the second position irradiated and the third position irradiated thereby determining the characteristics of the electronic device.

17. A method according to claim 16, wherein the condition of radiating the first and second charged beams is controlled by decreasing and increasing the beam current when absolute values of the respective potentials are larger and smaller than absolute values of corresponding set potential values, respectively.

18. A method according to claim 16, wherein the condition of radiating the first and second charged beam is controlled by increasing and decreasing an acceleration voltage when the respective potentials are larger and smaller than the set potential values, respectively.

19. A method according to claim 16, wherein the characteristics of the electronic device are determined by obtaining the ID-VG characteristics from the variation in an output of a transistor that corresponds to the potential at the third position with respect to the potential of a drain of said transistor that corresponds to the second position while the potential of the gate of said transistor that corresponds to the first position is fixed.

20. A characteristic test method of an electronic device comprising the steps of:
   a. simultaneously radiating first and second charged beams which can be independently controlled to at least first and second positions of the electronic device placed on a sample table simultaneously, sequentially radiating potential measuring beams pulsed at a predetermined frequency thereby creating a predetermined pulse on/off time interval, to the respective positions irradiated with the charged voltage supply beams, and separating and detecting only secondary electrons upon irradiation of the potential measuring beams from an amplitude of the frequency of a detected secondary electron signal;
   b. adjusting an analysis voltage to be supplied to an energy analyzer between said electronic device and a secondary electron detector such that a magnitude of a separately detected secondary electron signal is equal to a reference signal output, measuring the potentials at the positions irradiated with the potential measuring beams from a shift in the analysis voltage, and controlling the condition of radiating the plurality of voltage supplying beams so as to make the value of the potential equal to the set potential values of predetermined respective positions;
   c. setting the values of the potentials at a plurality of positions to be set objective potential values; and
   d. radiating a third charged beam to a third position of the electronic device different from the first and second positions of the electronic device to detect secondary electrons generated and determining the characteristics of the electronic device from a relationship between the potentials at the first, second, and third positions irradiated by measuring the potential at the third position of the electronic device.

21. A method according to claim 20, wherein the first and second charged beams are pulse beams having lower frequencies than that of the third charged beam and the radiating condition control comprises pulse control means for changing the pulse on/off time interval by decreasing and increasing an on time interval for increasing the beam current when absolute values of the respective potentials are larger and smaller than absolute values of corresponding set potential values, respectively.

22. A method according to claim 20, wherein the condition of radiating the first and second charged beams is controlled by decreasing and increasing the beam current when absolute values of the respective potentials are larger and smaller than absolute values of the set potential values, respectively.

23. A method according to claim 20, wherein the condition of radiating the first and second charged beams is controlled by increasing and decreasing an acceleration voltage when the respective potentials are larger and smaller than the set potential values, respectively.

24. A method according to claim 20, wherein the reference signal output is charged in accordance with a secondary electron emission ratio of a material of an irradiated position.

25. A method according to claim 20, wherein the characteristics of the electronic device are determined by obtaining the ID-VG characteristics from the variation of the potential in an output of a transistor that corresponds to the third position with respect to the potential of a drain that corresponds to the second position while the potential of a gate of said transistor that corresponds to the first position is fixed.

* * * * *

UNITED STATES PATENT AND TRADEMARK OFFICE
CERTIFICATE OF CORRECTION

PATENT NO. : 4,851,768                    Page 1 of 2
DATED     : 7/25/89
INVENTOR(S) : Yoshizawa et al.

It is certified that error in the above-identified patent and that said Letters Patent is hereby corrected as shown below:

| | | |
|---|---|---|
| col. 05, line 08 | delete "volaage" | insert --voltage-- |
| col. 05, line 39 | delete "s" | insert --is-- |
| col. 06, line 09 | after "voltage" | insert --$V_{TH}$-- |
| col. 06, line 36 | after "$V_{DD}$" | insert --.-- |
| col. 10, line 36 | delete "volta" | insert --voltage-- |
| col. 10, line 52 | delete "volaage" | insert --voltage-- |
| col. 13, line 44 | delete "$V_G k$" | insert --$V_G$-- |
| col. 13, line 55 | after "$V_{DG}$" | insert --.-- |
| col. 13, line 60 | after "value" | insert --$V_{DG}$-- |
| col. 14, line 17 | delete "ID" | insert --$I_D$-- |

UNITED STATES PATENT AND TRADEMARK OFFICE
CERTIFICATE OF CORRECTION

PATENT NO. : 4,851,768

DATED : 7/25/89

INVENTOR(S) : Yoshizawa et al.

It is certified that error in the above-identified patent and that said Letters Patent is hereby corrected as shown below:

| | | |
|---|---|---|
| col. 15, line 10 | delete "t e" | insert --the-- |
| col. 15, line 12 | delete "$V_D$ p31" | insert --$V_D$ - -- |
| col. 15, line 67 | after "$V_R$" | insert --.-- |
| col. 17, line 57 | delete "k" | insert --$\underline{k}$-- |
| col. 17, line 58 | delete "k" | insert --$\underline{k}$-- |
| col. 17, line 65 | delete "k" | insert --$\underline{k}$-- |
| col. 18, line 04 | delete "k" | insert --$\underline{k}$-- |
| col. 20, line 20 | delete "if" | insert --is-- |

Signed and Sealed this

Sixteenth Day of April, 1991

*Attest:*

HARRY F. MANBECK, JR.

*Attesting Officer*   *Commissioner of Patents and Trademarks*